United States Patent
Cheng et al.

(10) Patent No.: US 9,917,090 B1
(45) Date of Patent: Mar. 13, 2018

(54) VERTICAL ANTIFUSE STRUCTURES

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/243,491

(22) Filed: Aug. 22, 2016

(51) Int. Cl.
| | |
|---|---|
| *H01L 21/8234* | (2006.01) |
| *H01L 29/78* | (2006.01) |
| *H01L 27/105* | (2006.01) |
| *H01L 23/525* | (2006.01) |

(Continued)

(52) U.S. Cl.
CPC .. *H01L 27/1052* (2013.01); *H01L 21/823412* (2013.01); *H01L 21/823418* (2013.01); *H01L 21/823487* (2013.01); *H01L 23/5252* (2013.01); *H01L 27/088* (2013.01); *H01L 29/0847* (2013.01); *H01L 29/7827* (2013.01)

(58) Field of Classification Search
CPC ............. H01L 29/66795; H01L 29/785; H01L 29/7855; H01L 29/788; H01L 29/7889; H01L 27/0886; H01L 27/11206; H01L 27/11273; H01L 21/823487; H01L 21/823418; H01L 29/7827
See application file for complete search history.

(56) References Cited

U.S. PATENT DOCUMENTS

| | | |
|---|---|---|
| 6,388,305 B1 | 5/2002 | Bertin et al. |
| 6,396,121 B1 | 5/2002 | Bertin et al. |
| 6,509,624 B1 | 1/2003 | Radens et al. |

(Continued)

FOREIGN PATENT DOCUMENTS

| | | |
|---|---|---|
| CN | 102376358 A | 3/2012 |
| JP | 2012-38964 A | 2/2012 |

OTHER PUBLICATIONS

English translation for China Application No. CN102376358A.
English translation for Japan Application No. JP2012038964A.

*Primary Examiner* — Davienne Monbleau
*Assistant Examiner* — Leslie Pilar Cruz
(74) *Attorney, Agent, or Firm* — Vazken Alexanian; Ryan, Mason & Lewis, LLP

(57) ABSTRACT

Semiconductor devices and methods are provided in which vertical antifuse devices are integrally formed with vertical FET devices, wherein the vertical antifuse devices are formed as part of a process flow for fabricating the vertical FET devices. For example, a semiconductor device comprises a lower source/drain region formed on a substrate, and first and second vertical semiconductor fins formed on the lower source/drain region. First and second metal gate electrodes are formed on sidewalls of the first and second vertical semiconductor fins, respectively. An upper source/drain region is formed on an upper surface of the first vertical semiconductor fin, and a vertical source/drain contact is formed in contact with the upper source/drain region formed on the first vertical semiconductor fin. An upper end of the second vertical semiconductor fin is encapsulated in an insulating material so that the upper end of the second vertical semiconductor fin is floating.

20 Claims, 17 Drawing Sheets

(51) Int. Cl.
*H01L 27/088* (2006.01)
*H01L 29/08* (2006.01)

(56) References Cited

U.S. PATENT DOCUMENTS

| | | |
|---|---|---|
| 7,402,855 B2 | 7/2008 | Kurjanowicz |
| 7,572,682 B2 | 8/2009 | Yang et al. |
| 8,750,069 B2 | 6/2014 | Kim |
| 9,129,687 B2 | 9/2015 | Kurjanowicz |
| 2007/0076463 A1 | 4/2007 | Keshavarzi et al. |
| 2013/0077376 A1 | 3/2013 | Kim et al. |
| 2013/0240823 A1 | 9/2013 | Kwon |
| 2014/0346603 A1* | 11/2014 | Toh ................ H01L 27/11206 257/350 |

* cited by examiner

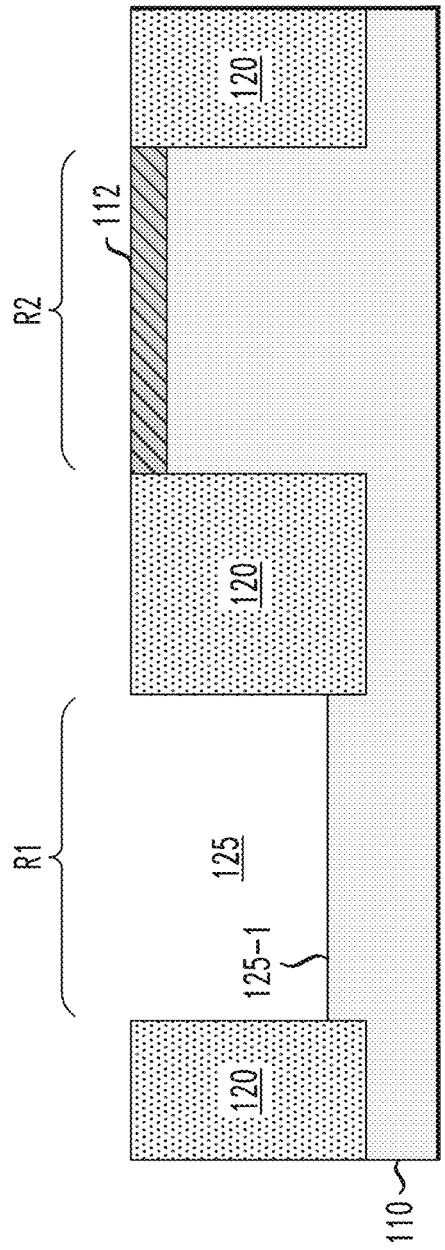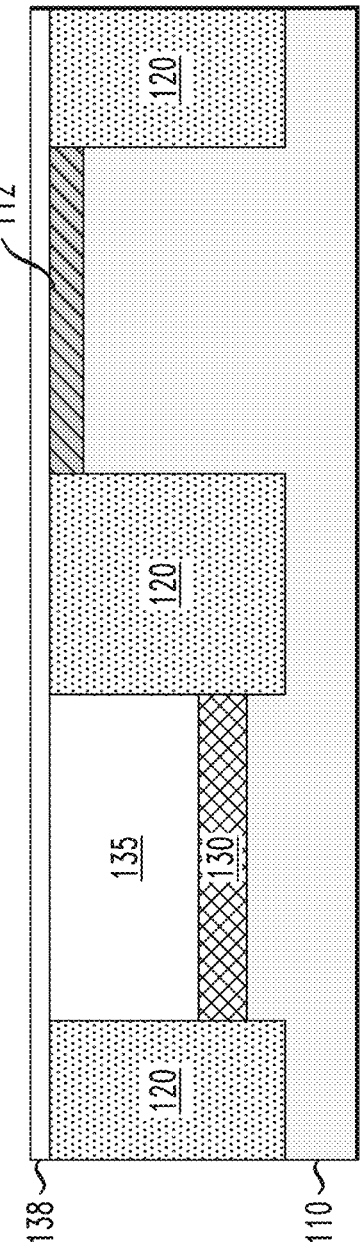

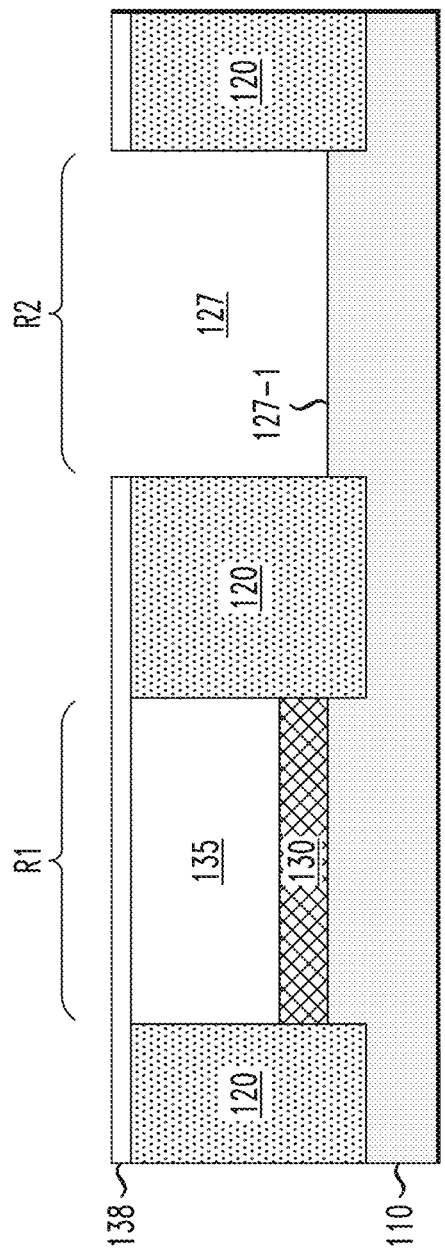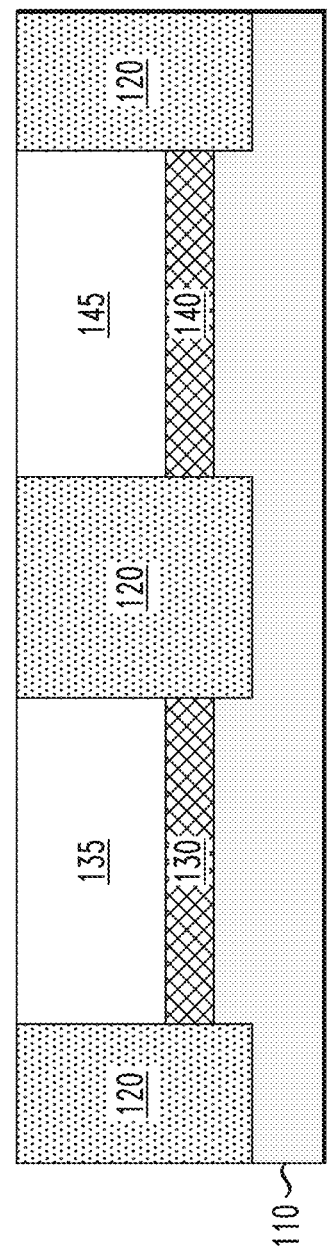

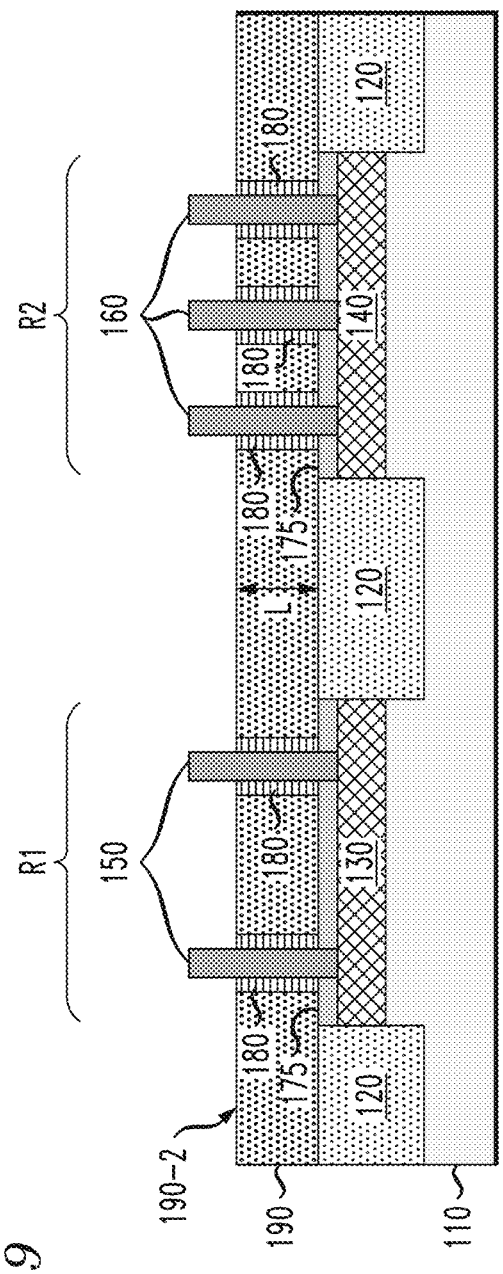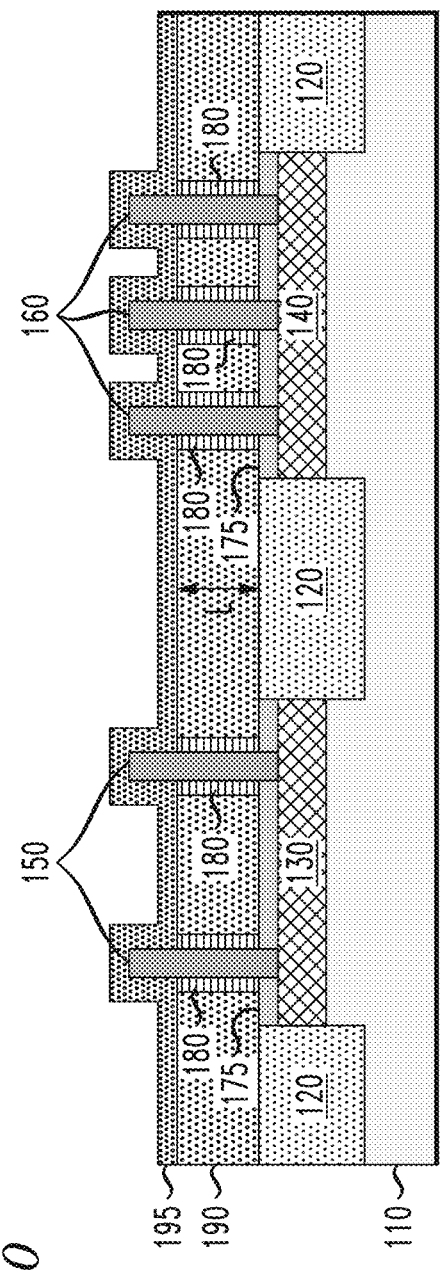
FIG. 19
FIG. 20

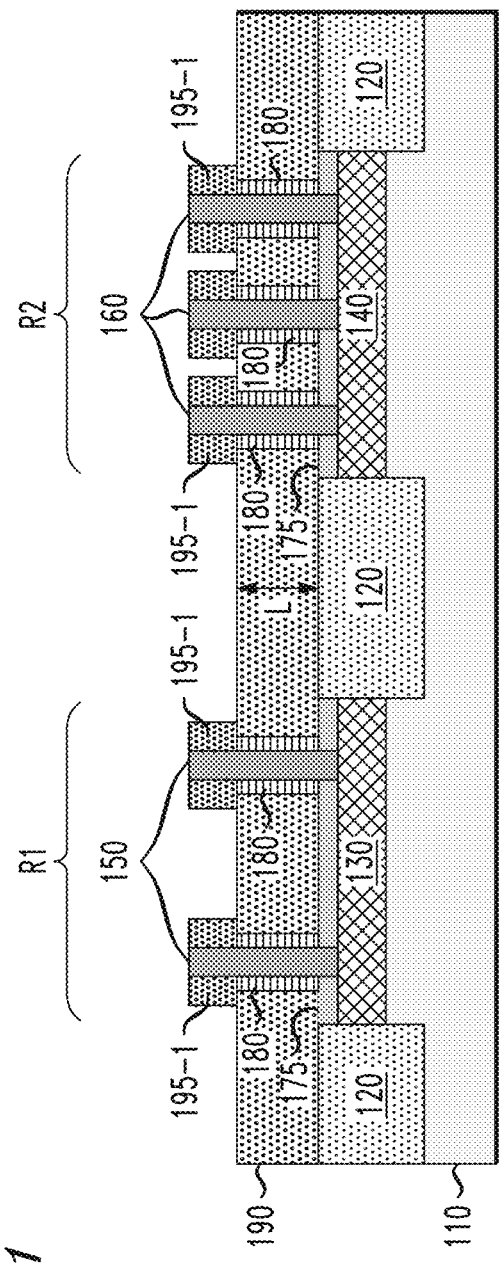
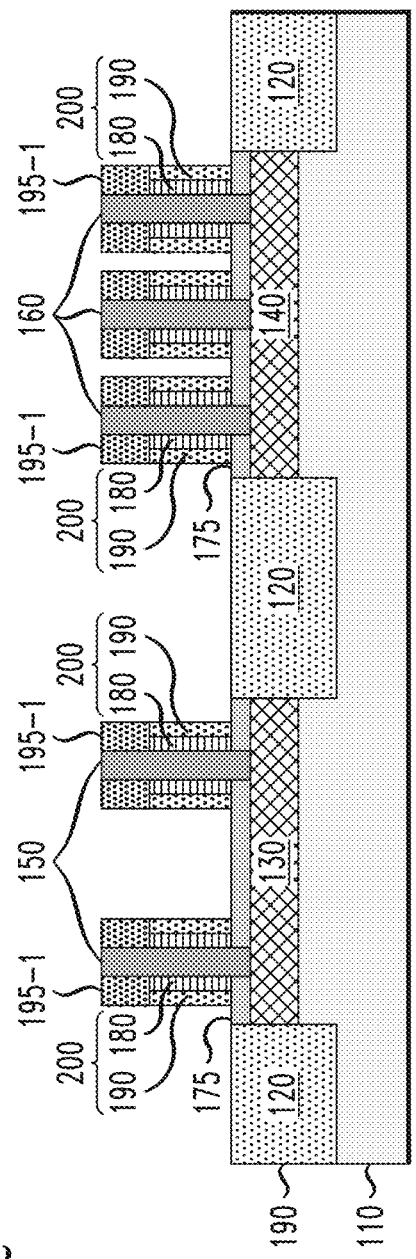
FIG. 21
FIG. 22

VERTICAL ANTIFUSE STRUCTURES

TECHNICAL FIELD

This disclosure relates generally to semiconductor fabrication techniques and, in particular, to structures and methods for fabricating antifuse structures.

BACKGROUND

An antifuse is an electrical device that performs a function that is opposite to that of a fuse. In particular, a fuse is an electrical device that has a low resistance conductive path that is designed to be broken when an electrical current through the low resistance conductive path exceeds a specified limit. In contrast, an antifuse is an electrical device that initially has a high resistance and does not conduct current, but which is designed to form an electrically conductive path when a voltage across the antifuse device exceeds a certain level. Antifuse devices are implemented in various OTP (one-time programmable) applications, such as a one-time programmable read-only memory (PROM), and programmable logic devices (PLDs) to configure logic circuits and create customized integrated circuit designs, one-time programmable read-only memory (PROM), etc. The fabrication of antifuse devices using conventional CMOS technologies can require multiple deposition and lithographic masking steps, which is time consuming and expensive. In this regard, the amount and complexity of additional processing steps that are incorporated as part of a semiconductor process flow to fabricate antifuse devices should be minimized to reduce the fabrication costs and processing time for constructing semiconductor chips.

SUMMARY

Embodiments of the invention include semiconductor devices having vertical antifuse devices that are integrated with vertical FET (field effect transistor) devices, as well as methods for integrally forming vertical antifuse devices as part of a process flow for fabricating vertical FET devices.

For example, one embodiment of the invention includes a semiconductor device. The semiconductor device comprises a lower source/drain region formed on a semiconductor substrate and a plurality of vertical semiconductor fins formed on the lower source/drain region. The vertical semiconductor fins include a first vertical semiconductor fin and a second vertical semiconductor fin. The semiconductor device further includes a first metal gate electrode formed on a sidewall surface of the first vertical semiconductor fin, a second metal gate electrode formed on a sidewall surface of the second vertical semiconductor fin, and an insulating layer to insulate the first and second metal gate electrodes. The semiconductor device further includes an upper source/drain region formed on an upper surface of the first vertical semiconductor fin, and a vertical source/drain contact formed in contact with the upper source/drain region formed on the upper surface of the first vertical semiconductor fin. An upper end of the second vertical semiconductor fin is encapsulated in an insulating material so that the upper end of the second vertical semiconductor fin is floating.

In one embodiment, the first vertical semiconductor fin, the first metal gate electrode, the lower source/drain region, and the upper source/drain region comprise a vertical FET device, and the second vertical semiconductor fin, the second metal gate electrode, and the lower source/drain region comprise a vertical antifuse device. In another embodiment, the vertical FET device and the vertical antifuse device comprise a 2T memory cell of an OTP (one time programmable) memory array.

Another embodiment of the invention includes a method for fabricating a semiconductor device, wherein the method comprises:

forming a lower source/drain region on a semiconductor substrate;

forming a plurality of vertical semiconductor fins on the lower source/drain region, the plurality of vertical semiconductor fins comprising a first vertical semiconductor fin and a second vertical semiconductor fin;

forming a first metal gate electrode on a sidewall surface of the first vertical semiconductor fin, and a second metal gate electrode on a sidewall surface of the second vertical semiconductor fin;

forming an insulating layer to insulate the first and second metal gate electrodes;

forming an upper source/drain region on an upper surface of the first vertical semiconductor fin;

forming a vertical source/drain in contact with the upper source/drain region formed on the upper surface of the first vertical semiconductor fin; and encapsulating an upper end of the second vertical semiconductor fin in an insulating material so that the upper end of the second vertical semiconductor fin is floating.

Other embodiments will be described in the following detailed description of embodiments, which is to be read in conjunction with the accompanying figures.

BRIEF DESCRIPTION OF THE DRAWINGS

FIGS. 5 through 31 schematically illustrate a method for fabricating the semiconductor device of FIGS. 1A/1B, according to an embodiment of the invention, wherein:

FIG. 5 is a cross-sectional view of the semiconductor device at an initial stage of fabrication starting with a silicon nitride layer formed on a surface of a semiconductor substrate;

FIG. 6 is a schematic cross-sectional side view of the semiconductor structure of FIG. 5 after patterning the silicon nitride layer to form an etch mask comprising openings that define isolation regions to be formed in a surface of the semiconductor substrate;

FIG. 7 is a schematic cross-sectional side view of the semiconductor structure of FIG. 6 after etching portions of the semiconductor substrate to form a pattern of trenches in the surface of the semiconductor substrate;

FIG. 8 is schematic cross-sectional side view of the semiconductor structure of FIG. 7 after filling the trenches with insulating/dielectric material to form shallow trench isolation (STI) regions;

FIG. 9 is a schematic cross-sectional side view of the semiconductor structure of FIG. 8 after forming a recess within a first device region defined by surrounding STI regions;

FIG. 10 is a schematic cross-sectional side view of the semiconductor structure of FIG. 9 after forming a lower source/drain region and semiconductor channel layer in the recess within the first device region and forming a hard mask layer over the semiconductor structure;

FIG. 11 is a schematic cross-sectional side view of the semiconductor structure of FIG. 10 after forming a recess within a second device region defined by the surrounding STI regions;

FIG. 12 is a schematic cross-sectional side view of the semiconductor structure of FIG. 11 after forming a lower source/drain region and a layer of channel material within the recess of the device region R2, and removing a remaining portion of the hard mask layer;

FIG. 13 is a schematic cross-sectional side view of the semiconductor structure of FIG. 12 after recessing the STI regions and patterning the layers of semiconductor channel material in the first and second device regions to form the vertical semiconductor fins in the respective device regions;

FIG. 14 is a schematic cross-sectional side view of the semiconductor structure of FIG. 13 after depositing and planarizing a layer of insulating material over the semiconductor structure;

FIG. 15 is a schematic cross-sectional side view of the semiconductor structure of FIG. 14 after recessing the layer of insulating material to form bottom spacers in the first and second device regions;

FIG. 16 is a schematic cross-sectional side view of the semiconductor structure of FIG. 15 after forming a high-k metal gate stack structures on sidewalls of the vertical semiconductor fins within the first and second device regions;

FIG. 17 is a schematic cross-sectional side view of the semiconductor structure of FIG. 16 after depositing and planarizing a layer of gate electrode material;

FIG. 18 is a schematic cross-sectional side view of the semiconductor structure of FIG. 17 after recessing the layer of gate electrode material;

FIG. 19 is a schematic cross-sectional side view of the semiconductor structure of FIG. 18 after recessing exposed portions of the high-k metal gate stack structures on the sidewalls of the vertical semiconductor fins down to the recessed surface of the layer of gate electrode material;

FIG. 20 is a schematic cross-sectional side view of the semiconductor structure of FIG. 19 after depositing a thin conformal layer of spacer material layer over surface of the semiconductor structure;

FIG. 21 is a schematic cross-sectional side view of the semiconductor structure of FIG. 20 after patterning the thin conformal layer of spacer material to form disposable spacers on the exposed sidewalls of the vertical semiconductor fins;

FIG. 22 is a schematic cross-sectional side view of the semiconductor structure of FIG. 21 after using the disposable spacers as an etch mask to etch the exposed portions of the gate electrode material to form metal gate electrodes on the vertical semiconductor fins;

FIG. 23 is a schematic cross-sectional side view of the semiconductor structure of FIG. 22 after removing the disposable spacers, and after depositing a layer of insulating material and planarizing the layer of insulating material down to the upper surface of the vertical semiconductor fins;

FIG. 24 is a schematic cross-sectional side view of the semiconductor structure of FIG. 23 after recessing the layer of insulating material to form an upper insulating spacer;

FIG. 25 is a schematic cross-sectional side view of the semiconductor structure of FIG. 24 after forming an ILD (inter-level dielectric layer) over the upper insulating spacer and forming a hard mask layer over the ILD layer;

FIG. 26 is a schematic cross-sectional side view of the semiconductor structure of FIG. 25 after patterning the hard mask layer to expose portions of the ILD layer in the first device region, and etching upper portions of the vertical semiconductor fins in the first device region;

FIG. 27 is a schematic cross-sectional side view of the semiconductor structure of FIG. 26 after forming upper source/drain regions on top of the vertical semiconductor fins in the first device region;

FIG. 28 is a schematic cross-sectional side view of the semiconductor structure of FIG. 27 after removing the patterned hard mask layer, and depositing and patterning another hard mask layer over the ILD layer to expose portions of the ILD layer in the second device region;

FIG. 29 is a schematic cross-sectional side view of the semiconductor structure of FIG. 28 after etching upper portions of the vertical semiconductor fins in the second device region;

FIG. 30 is a schematic cross-sectional side view of the semiconductor structure of FIG. 29 after forming upper source/drain regions on top of the vertical semiconductor fins in the second device region; and FIG. 31 is a schematic cross-sectional side view of the semiconductor structure of FIG. 30 after removing the patterned hard mask layer.

DETAILED DESCRIPTION

Embodiments of the invention will now be described in further detail with regard to semiconductor devices having vertical antifuse devices that are integrated with vertical FET devices, as well as methods for integrally forming vertical antifuse devices as part of a FEOL (front-end-of-line) process flow for fabricating vertical FET devices. As explained in further detail below, semiconductor fabrication techniques according to embodiments of the invention enable vertical antifuse structures to be readily fabricated using CMOS (complementary metal oxide semiconductor) process modules in a FEOL process flow to construct vertical FET devices without the need for additional processes steps or processing time to construct the vertical antifuse devices. The exemplary semiconductor process flows described herein allow integration of vertical anti-fuse devices with vertical FET devices for technology nodes of 7 nm and beyond.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein.

In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
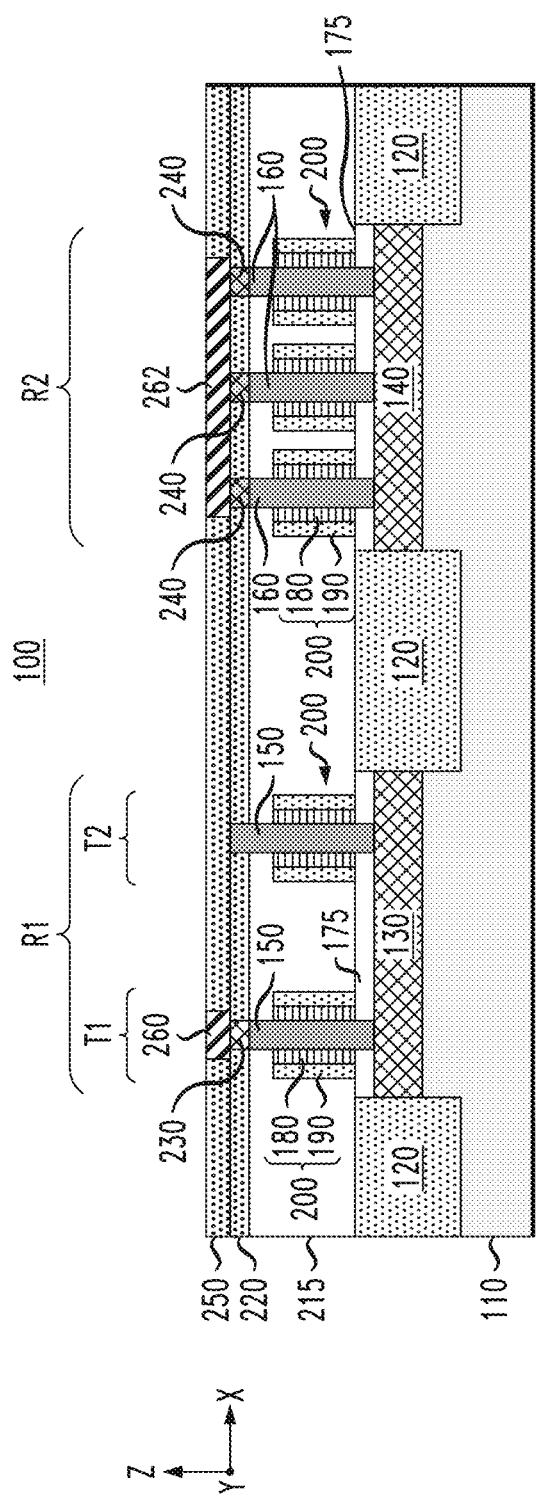
FIGS. 1A and 1B are schematic views of a semiconductor device having vertical antifuse devices that are integrated with vertical FET devices, according to an embodiment of the invention.
Figure 1B:
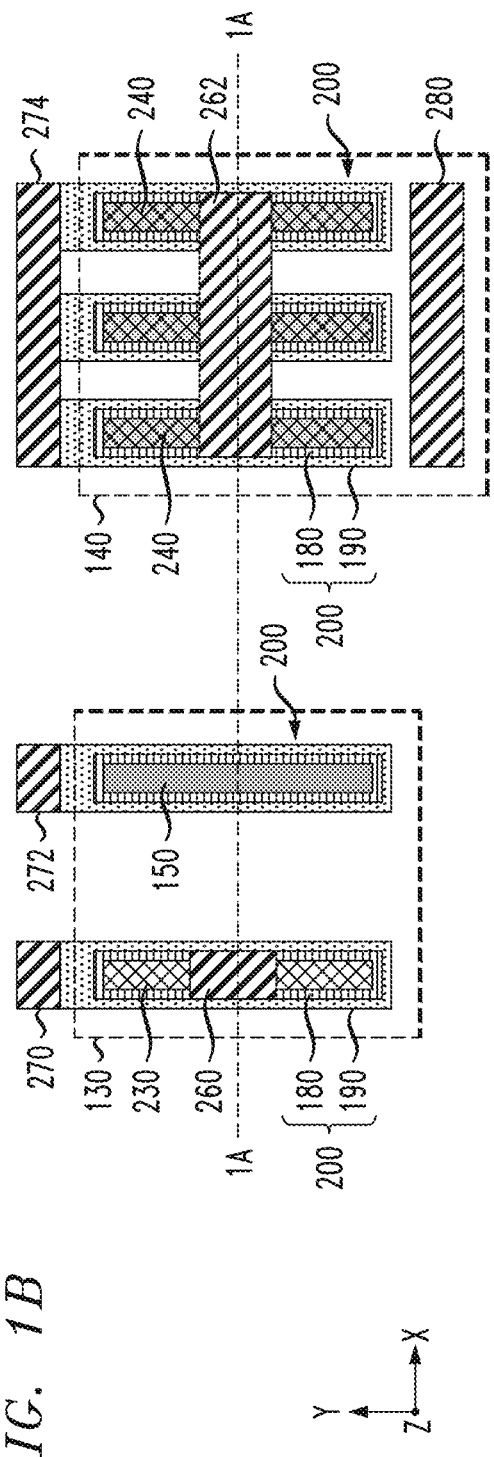

FIGS. 1A and 1B are schematic views of a semiconductor device 100 having vertical antifuse devices that are integrated with vertical FET devices, according to an embodiment of the invention. FIG. 1A is a schematic side view of the semiconductor device 100 taken along line 1A-1A in FIG. 1B, and FIG. 1B is a schematic top plan view of the semiconductor device 100 shown in FIG. 1A. More specifically, FIG. 1A is a schematic side view of the semiconductor device 100 in an X-Z plane, and FIG. 1B is a top view showing a layout of various elements within an X-Y plane, as indicated by the respective XYZ Cartesian coordinates shown in FIGS. 1A and 1B. It is to be understood that the term "vertical" or "vertical direction" as used herein denotes a Z-direction of the Cartesian coordinates shown in FIGS. 1A/1B, and the term "horizontal" or "horizontal direction" as used herein denotes an X-direction and/or Y-direction of the Cartesian coordinates shown in FIGS. 1A/1B. As collectively shown in FIGS. 1A/1B, the semiconductor device 100 comprises a semiconductor substrate 110 and shallow trench isolation (STI) regions 120 which define and isolate a first device region R1 and a second device region R2. The semiconductor device 100 further comprises lower source/drain regions 130 and 140, lower insulating spacers 175, vertical semiconductor fins 150 and 160, metal gate electrodes 200 (each comprising a high-k metal gate stack structure 180 and a gate electrode layer 190) disposed on and around a portion of the sidewalls of the vertical semiconductor fins 150 and 160, an upper insulating spacer 215, an ILD (inter-level dielectric) layer 220, upper source drain/ regions 230 and 240, and a capping layer 250. It is to be understood that the term "source/drain region" as used herein means that a given source/drain region can be either a source region or a drain region, depending on the application.

In one embodiment, the high-k metal gate stack structures 180 each comprise a thin conformal layer of gate dielectric material formed on the surface of vertical semiconductor fins 150/160, and a thin layer of work function metal (WFM) formed over the conformal layer of gate dielectric material. The lower insulating spacers 175 and the upper insulating spacer 215 collectively provide a layer of insulating material which encapsulates the vertical semiconductor fins 150/160 and metal gate electrodes 200 in insulating material to electrically insulate the vertical semiconductor fins 150/160 and metal gate electrodes 200 from surrounding components.

The semiconductor device 100 further comprises vertical source/drain contacts 260 and 262, vertical gate contacts 270, 272, and 274, and a vertical source/drain contact 280. The vertical source/drain contact 260 is formed in contact with an upper source/drain region 230 formed on one of the vertical semiconductor fins 150 in the first device region R1, and the vertical source/drain contact 262 is commonly connected to each of the upper source/drain regions 240 in the second device region R2. The vertical gate contacts 270 and 272 connect to different metal gate electrodes 200 in the first device region R1, and the vertical gate contact 274 is commonly connected to each of the metal gate electrodes 200 in the second device region R2. The vertical source/ drain contact 280 connects to the lower source/drain region 140 in the second device region R2. The lower source/drain regions 130 and 140 shown in FIG. 1A have footprint areas illustrated by dashed lines in FIG. 1B. As depicted in FIG. 1B, the lower source/drain regions 130 and 140 are sized and dimensioned based on the size and layout of the respective set of vertical semiconductor fins 150 and 160 and the vertical contact 280.

The vertical gate contacts 270, 272, and 274 are formed through the various layers 250/220/215 and connected to extended portions of the gate electrode material 190 that extend (in the Y direction) past one end of the vertical semiconductor fins 150 and 160. In addition, the vertical source/drain contact 280 is formed through the various layers 250/220/215/175 and connected to an extended portion of the lower source/drain region 140 which extends (in the Y direction) past one end of the semiconductor fins 160.

In one illustrative embodiment as shown in FIGS. 1A and 1B, there are two vertical devices T1 and T2 in the first device region R1. The first vertical device T1 comprises a vertical FET device, and the second vertical device T2 comprises a vertical antifuse device. In one embodiment, the vertical devices T1 and T2 are n-type devices, which form a 2T memory cell. The vertical FET device T1 and vertical antifuse device T2 are similar in structure in that each comprises a vertical semiconductor fin 150 (which serves as a vertical channel structure), and a metal gate electrode 200, and commonly share the lower source/drain region 130. However, in the example embodiment of FIGS. 1A/1B, the vertical FET device T1 and vertical antifuse device T2 differ in structure as the vertical FET device T1 comprises an upper source/drain region 230 formed on an upper surface of the respective vertical semiconductor fin 150, whereas the vertical antifuse structure T2 does not have an upper source/ drain region formed on an upper surface of the respective vertical semiconductor fin 150. Another structural difference is that the vertical source/drain contact 260 is formed in contact with only the upper source/drain region 230 of the vertical FET device T1, whereas the upper end of the vertical semiconductor fin 150 of the vertical antifuse device T2 is in an unconnected and electrically floating.

In one embodiment of the invention, the programming (or "burning") of the vertical antifuse device T2 is achieved by forming a conductive channel between the metal gate electrode 200 and the lower source/drain region 130 due to the breakdown of the high-k metal gate stack structure 180 caused by a high-voltage pulse applied to the vertical gate contact 272 of the vertical antifuse device T2. As noted above, the high-k metal gate stack structure 180 of the vertical antifuse device T2 comprises a thin layer of high-k dielectric material (i.e., gate dielectric) formed on the sidewall surface of the vertical semiconductor fin 150 and thin conformal work function metal formed over the gate dielectric. In this regard, formation of the conductive channel of the vertical antifuse device T2 is achieved, at least in part, by the dielectric breakdown of the gate dielectric material of the high-k metal gate stack structure 180 caused by the application of a high-voltage pulse to the metal gate electrode 200 of the vertical antifuse device T2. Methods and circuits for programming a vertical antifuse device, and programming OTP memory cells comprising vertical antifuse devices, will be discussed in further detail below with reference to FIGS. 3 and 4.

The vertical antifuse devices (e.g., the vertical antifuse device T2) which are formed in different regions of the semiconductor device 100 are integrally formed with other FET devices in the same or different device regions of the semiconductor device 100 using methods discussed below. In the example embodiment of FIGS. 1A/1B, the lower source/drain region 140, the vertical semiconductor fins 160 and corresponding metal gate electrodes 200, and the upper source/drain regions 240, collectively form a single vertical FET device (with three vertical FET channel segments) in the device region R2, which can be an n-type FET device or a p-type FET device. The source regions 240 are commonly connected to the upper source/drain contact 262, and the metal gate electrodes 200 are commonly connected to the vertical gate contact 274. The lower source/drain region 140 in the second device region R2 serves as a common source/drain region for each of the vertical semiconductor fins 160.

In the embodiment of FIGS. 1A/1B, embodiment, the metal gate electrodes 200 of the vertical semiconductor fins 160 (channel segments of the vertical FET device) are concurrently activated or deactivated based on the voltage applied to the gate contact 274 in the device region R2. In an alternate embodiment, the metal gate electrodes 200 in the device region R2 can be connected to separate gate contacts. With this alternate embodiment, the different channel segments of the vertical FET devices can be independently controlled to selectively activate or deactivate the different segments of the vertical FET device, as needed, depending on the application (e.g., controllably adjust the driving strength (amount of current) of the vertical FET devices in the device region R2).

On the other hand, in the exemplary embodiment of FIGS. 1A and 1B, the vertical devices T1 and T2 in the device region R1 have separate vertical gate contacts 270 and 272 to independently apply different voltages to the metal gate electrodes 200 of the vertical device T1 and T2, respectively, for purposes of programming and reading 2T memory cells, as discussed below. In an alternate embodiment, the metal gate electrodes 200 of the vertical devices T1 and T2 are commonly connected to the same vertical gate contact, as shown in FIGS. 2A and 2B.

Figure 2A:
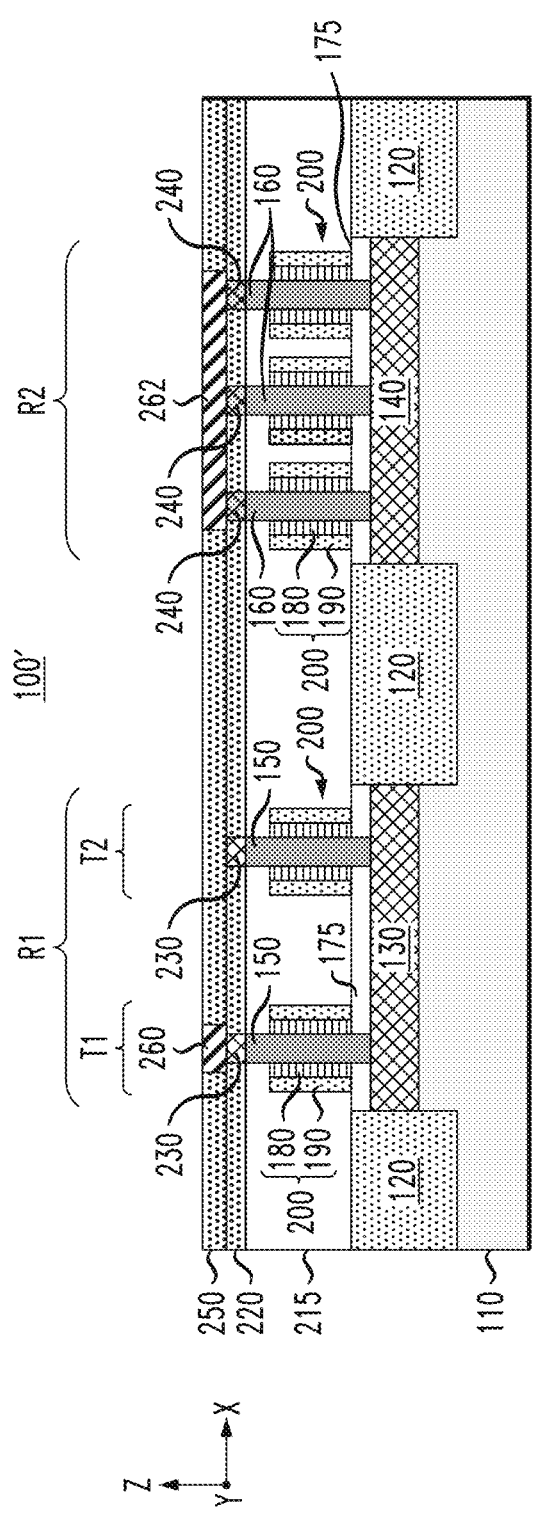
FIGS. 2A and 2B are schematic views of a semiconductor device having vertical antifuse devices that are integrated with vertical FET devices, according to an embodiment of the invention.
Figure 2B:
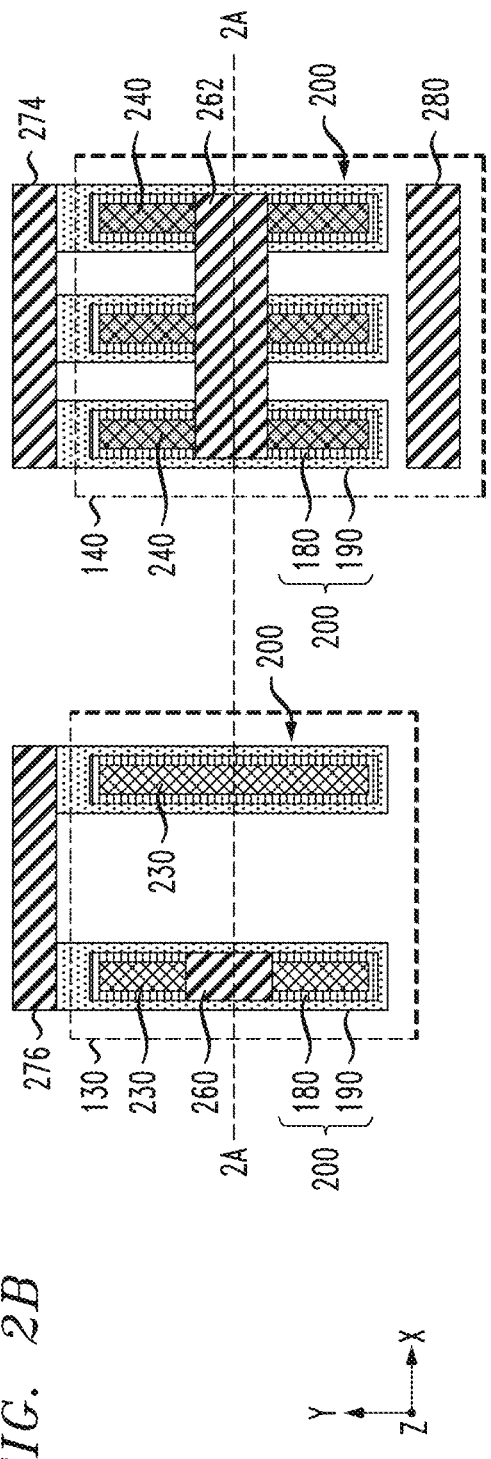

In particular, FIGS. 2A and 2B are schematic views of a semiconductor device 100' having vertical antifuse devices that are integrated with vertical FET devices, according to an embodiment of the invention. The semiconductor device 100' in FIGS. 2A/2B is similar to the semiconductor device 100 in FIGS. 1A/1B, except that upper source/drain regions 230 are formed on all of the vertical semiconductor fins 150 in the device region R1. In addition, the metal gate electrodes 200 of the vertical devices T1 and T2 are commonly connected to one vertical gate contact 276. While an upper source/drain region 230 is formed on top of the vertical semiconductor fin 150 of the vertical antifuse device T2, no upper source/drain contact is formed in contact with the upper source/drain region 230. Instead, the upper source/drain region 230 formed on the upper surface of the vertical semiconductor fin 150 of the vertical antifuse device T2 is encapsulated in the insulating material of the ILD layer 220 and the capping layer 250. As such, the upper source/drain region 230 of the vertical antifuse device T2 comprise a floating source/drain region.

Figure 3:
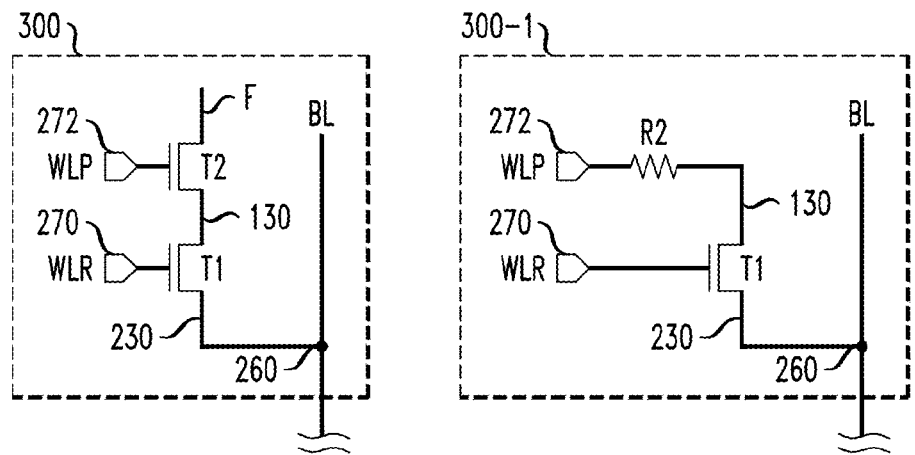
FIG. 3 schematically illustrates a method for programming a 2T memory cell comprising a vertical antifuse device and a vertical FET device, according to an embodiment of the invention.

FIG. 3 schematically illustrates a method for programming a 2T memory cell comprising a vertical antifuse device and a vertical FET device, according to an embodiment of the invention. In particular, FIG. 3 schematically illustrates a 2T memory cell 300 comprising a vertical FET device T1 and a vertical antifuse device T2 prior to programming the 2T memory cell 300. In addition, FIG. 3 schematically illustrates a programmed state 300-1 of the 2T memory cell 300 after applying a programming voltage to the gate terminal of the vertical antifuse device T2 to cause a hard gate dielectric breakdown and create a conductive channel in which the antifuse device T2 effectively operates as a low-resistance resistor R2. For purposes of illustration, the 2T memory cell and programming method of FIG. 3 will be discussed with reference to the vertical devices T1 and T2 and associated contacts in the device region R1 of the semiconductor device 100 of FIGS. 1A/1B. In this regard, the vertical gate contacts 270 and 272, the lower source/drain region 130, the upper source/drain region 230, and the vertical source/drain contact 260 as shown in FIGS. 1A/1B are also schematically depicted in FIG. 3. As shown in FIG. 3, the vertical source/drain contact 260 is connected to a bit line BL of a memory cell array.

In the example embodiment of FIG. 3, the vertical FET device T1 (or select transistor) and the vertical antifuse device T2 (or program transistor) are connected in series, but the vertical antifuse device T2 has a floating source/drain terminal (denoted F). In FIG. 3, it is assumed that the vertical gate contacts 270 and 272 are connected to separate word lines WLR and WLP, respectively. In the non-programmed state of the 2T memory cell 300, when a normal operating supply voltage (e.g., word line read (WLR) signal) such as 1.0 V, 1.5 V, etc., is applied to the gate contacts 270 and 272 of the vertical devices T1 and T2, no current is sensed along the bit line BL. In particular, in the non-programmed state, the equivalent circuit for the vertical antifuse device T2 is a capacitor. In this regard, since no current flows through the vertical devices T1 and T2, no current is sensed along the bit line BL and, thus, the 2T memory cell 300 is deemed to store a logic "0" by default (prior to programming).

On the other hand, when a large programming voltage (VPP) is applied (as a word line program (WLP) signal) to the gate contact 272 of the vertical antifuse device T2, a hard gate dielectric breakdown occurs, resulting in the formation of a low-resistance conductive path, wherein the equivalent circuit for the programmed vertical antifuse device T2 is a resistor R2, as shown in FIG. 3. In the programmed state 300-1, when a normal operating supply voltage (e.g., WLR signal) is applied to the gate contacts 270 and 272 of the respective vertical devices T1 and T2, a current will flow through the vertical devices T1 and T2 (with T2 effectively operating as a resistor R2), as well as the bit line BL. The current flow on the bit line BL will be sensed as a logic "1" for the programmed 2T memory cell.

In the example embodiments shown in FIGS. 1A/1B and 3, the metal gate electrodes 200 of the vertical devices T1 and T2 are connected to separate vertical gate contacts 270 and 272, respectively. In this embodiment, the high-k gate stack structures 180 (and in particular, the gate dielectric layer) of the vertical devices T1 and T2 can be formed to have the same thickness. This is because a separate programming voltage VPP (or WLP signal), which is relatively much higher than the normal operating voltage signal (e.g., WLR signal), can be separately applied to the vertical gate contact 272 of the vertical antifuse device T2 to cause a hard breakdown of the high-k metal gate stack structure 180 (e.g., hard dielectric breakdown of the gate dielectric layer) and, thus, program the vertical antifuse device T2, without damaging the high-k metal gate stack structure 180 of the vertical FET device T1.

In another embodiment of the invention, as shown in FIG. 2B, the metal gate electrodes 200 of the vertical devices T1 and T2 are connected to the same vertical gate contact 274. In this embodiment, the high-k gate stack structures 180 (and in particular, the gate dielectric layer) of the vertical devices T1 and T2 can be formed to have different thicknesses, wherein the high-k gate stack structure 180 of the vertical antifuse device T2 is relatively much thinner than the high-k gate stack structure 180 of the vertical FET device T1. This is because when a target programming voltage VPP (or WLP signal) is applied to the common vertical gate contact 276, the programming voltage VPP can be selected to cause a hard breakdown of the thinner high-k metal gate stack structure 180 (e.g., hard dielectric breakdown of the gate dielectric layer) of the vertical antifuse device T2, without damaging the thicker high-k metal gate stack structure 180 of the vertical FET device T1. As such, the programming voltage VPP can be applied to the common vertical gate contact 276 and program the vertical antifuse device T2 without damaging the vertical FET device T1, which will be discussed now in further detail with reference to FIG. 4.

Figure 4:
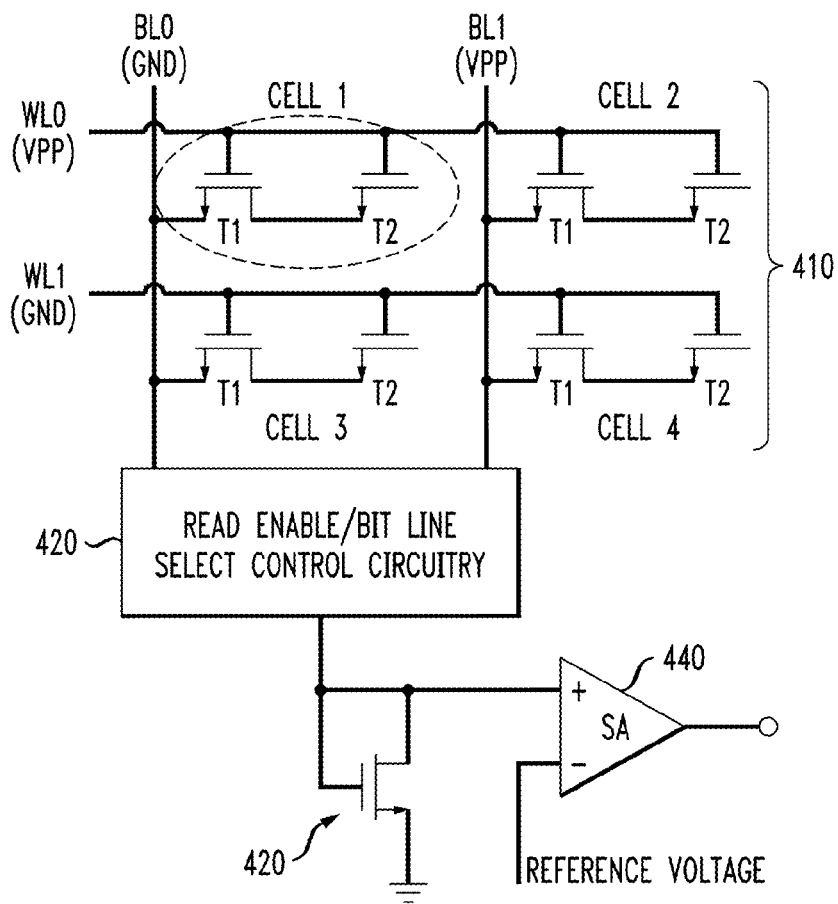
FIG. 4 is a schematic circuit diagram of a one-time programmable memory having array of 2T memory cells comprising vertical antifuse devices and vertical FET devices, according to an embodiment of the invention.

FIG. 4 is a schematic circuit diagram of a one-time programmable (OTP) memory having array of 2T memory cells comprising vertical antifuse devices and vertical FET devices, according to an embodiment of the invention. In particular, FIG. 4 schematically illustrates an OPT memory system 400 comprising a memory cell array 410, read enable/bit line control circuitry 420, a diode-connected FET device 420, and a sense amplifier 440. The memory cell array 410 comprises an array of 2T memory cells (e.g., Cell 1, Cell 2, Cell 3, Cell 4, . . . ) connected to respective word lines (WL0, WL1, . . . ) and bit lines (BL0, BL1, . . . ). While only one diode-connected FET device 420/ sense amplifier 440 pair are shown for ease of illustration, one of ordinary skill in the art readily understands that the memory system 400 would have a diode-connected FET device 420/sense amplifier 440 pair for each bit line in the memory array 410.

The read enable/bit line control circuity 420 comprises input ports that are connected to respective bit lines (BL0, BL1, . . . ), and output ports, wherein each output port is connected to a terminal of the diode-connected FET device 420 and a non-inverting input (+) of the sense amplifier 440 of a corresponding one of the diode 410/sense amplifier 440 pairs of the memory system 400. An inverting input (−) of each sense amplifier 400 is connected to a reference voltage supply node. While not specifically shown in FIG. 4, the memory system 400 would further comprise row decoder circuitry, word line driver circuitry, and other control circuity to control activation of the word lines (WL0, WL1, . . . ).

For illustrative purposes, it is assumed that each 2T memory cell in the memory cell array 410 comprises a vertical FET device T1 and a vertical antifuse device T2 having metal gate electrodes 200 that are commonly connected to a single vertical gate contact 276, as shown in the exemplary embodiment of FIG. 2B, and that the vertical gate contact 276 is connected to a respective one of the word lines in the memory cell array 410. In this regard, it is assumed that the high-k gate stack structures 180 of the vertical antifuse devices T2 are thinner than the high-high gate stack structures 180 of the vertical FET devices T1 of the memory cells. As discussed above, this allow a suitable programming voltage VPP to be applied to a given word line to program the vertical antifuse device T2 in a target memory cells without damaging the thicker high-k metal gate stack structure 180 of the vertical FET device T1 in the target memory cell.

By way of example, FIG. 4 shows state of the memory system 400 for programming a target memory cell, Cell 1, by the application of a programming voltage VPP on the word line WL0. As further shown in FIG. 4, to program the target memory Cell 1, a ground voltage (GND) is applied to the other word lines (e.g., WL1, . . . ) that are not connected to the gate terminals of the vertical devices T1 and T2 of the target memory Cell 1. Moreover, to program the target memory Cell 1, the read enable/bit line select control circuity 410 connects the bit line BL0 to a ground voltage (GND) and applies the programming voltage VPP to all other bit lines (e.g., BL1, . . . ). In this state, the application of the programming voltage VPP to the word line WL0, and connecting the bit line BL0 to ground potential (GND) results in a hard breakdown of the high-k gate stack structure 180 of the vertical antifuse device T2 in the target memory Cell 1, resulting in the programmed state of the 2T memory cell 300-1 shown in FIG. 3. In one embodiment, the voltage level of the programming voltage VPP is the same as the voltage level of the WLR enable signal that is applied to the word lines when reading the memory cells. In another embodiment, the programming voltage VPP may be slightly higher than the voltage of the normal WLR enable signal to ensure an effective hard breakdown of the high-k metal gate stack structure 180 of the vertical antifuse device T2, while avoiding damage to the high-k metal gate stack structure 180 of the vertical FET device T1.

Figure 5:
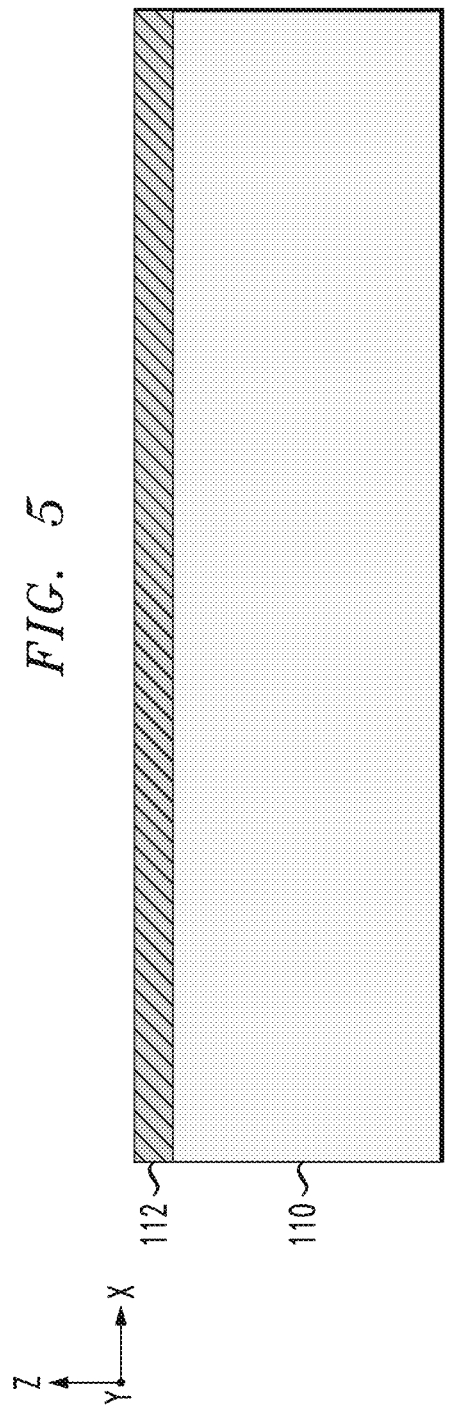

Methods for fabricating the semiconductor device 100 shown in FIGS. 1A/1B will now be discussed in further detail with reference to FIGS. 5 through 31, which schematically illustrate the semiconductor device 100 of FIGS. 1A/1B at various stages of fabrication. Referring initially to FIG. 5, a cross-sectional view of is shown of the semiconductor device at an initial stage of fabrication starting with the semiconductor substrate 110 and a silicon nitride (SiN) layer 112 (or "pad nitride" layer) formed on a surface of the semiconductor substrate 110, according to an embodiment of the invention. In one embodiment, the semiconductor substrate 110 comprises a bulk semiconductor substrate formed of, e.g., silicon, or other types of semiconductor substrate materials that are commonly used in bulk semiconductor fabrication processes such as germanium, silicon-germanium (SiGe) alloy, silicon carbide (SiC), silicon-germanium carbide (SiGeC) alloy, or compound semiconductor materials (e.g. III-V and II-VI). Non-limiting examples of compound semiconductor materials include gallium arsenide (GaAs), indium arsenide (InAs), and indium phosphide (InP).

In another embodiment, the semiconductor substrate 110 may comprise a SOI (silicon on insulator) substrate, which comprises an insulating layer (e.g., oxide layer) disposed between a base semiconductor substrate (e.g., silicon substrate) and an active semiconductor layer (e.g., active silicon layer) in which active circuit components are formed. In other embodiments, the semiconductor substrate 110 may be a semiconductor-on-insulator substrate (SeOI), a germanium-on-insulator substrate (GeOI), or a silicon-germanium-on-insulator substrate (SGOI). In all embodiments, an upper surface or layer of the SOI substrate or the bulk semiconductor substrate, for example, may comprises single crystalline silicon.

Figure 6:
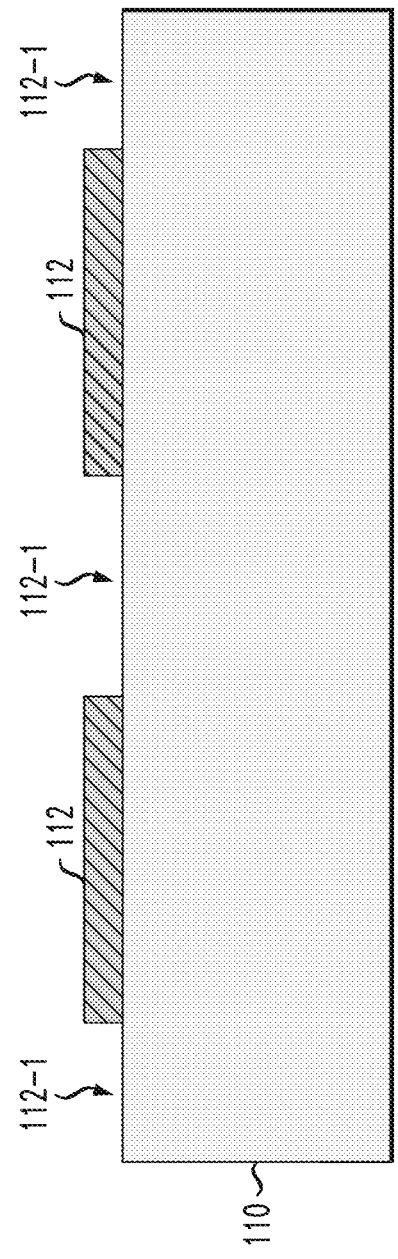

A next step in the illustrative fabrication process comprises patterning the pad nitride layer 112 to form an etch mask that is used to etch isolation trenches in the semiconductor substrate 110. For example, FIG. 6 is a schematic cross-sectional side view of the semiconductor structure of FIG. 5 after patterning the pad nitride layer 112 to form an etch mask comprising openings 112-1 that define isolation regions to be formed in a surface of the semiconductor substrate 110, according to an embodiment of the invention. The pad nitride layer 112 can be patterned using standard photolithography techniques. For example, a layer of photoresist material is deposited on top of the pad nitride layer 112 and lithographically patterned (exposed and developed) to form a photoresist mask having a target pattern which is to be transferred to the pad nitride layer 112. An etch process is then performed using the photoresist mask to etch exposed portions of the pad nitride layer 112 down to the surface of the semiconductor substrate 110 and thereby form the openings 112-1 in the pad nitride layer 112. The etch process can be performed using a dry etch process such as RIE (reactive ion etching) or other etch processes with etching chemistries that are suitable to etch the material of the pad nitride layer 112.

Figure 7:
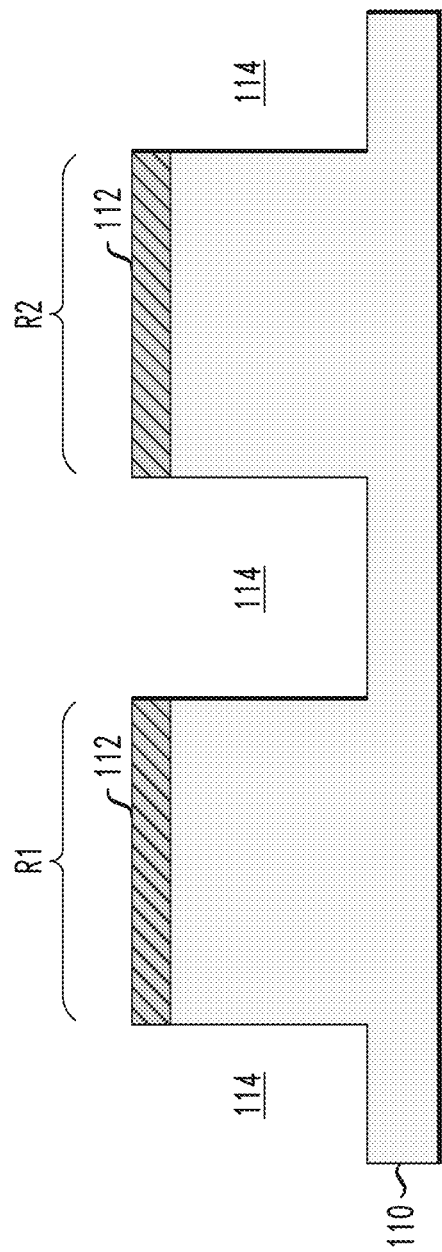
Figure 8:
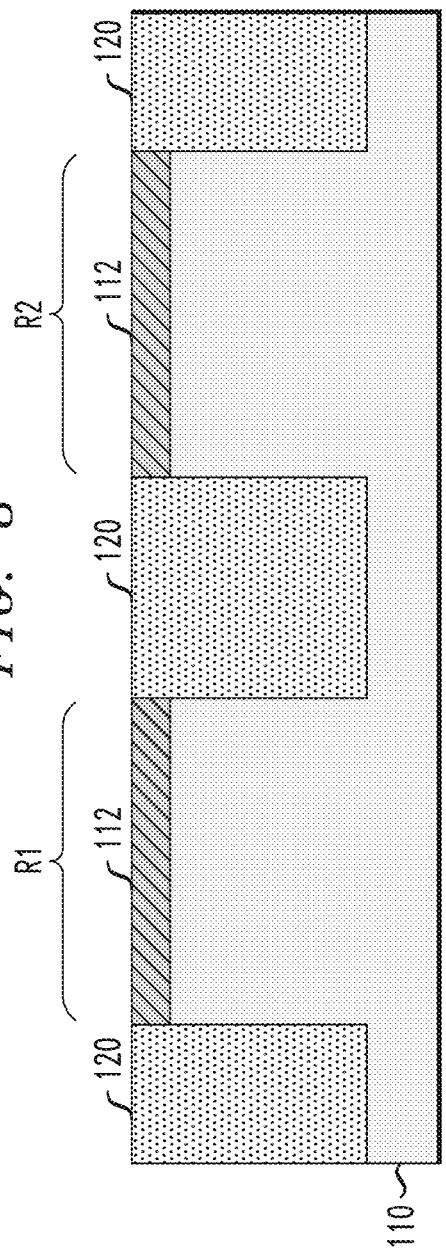

The fabrication process continues with forming shallow trench isolation (STI) regions in the surface of the semiconductor substrate 110 to define device regions. The STI regions can be formed using a standard technique that involves, e.g., etching a pattern of trenches in the surface of the semiconductor substrate 110, depositing one or more insulating/dielectric materials (such silicon dioxide) to fill the trenches, and then removing the excess insulating/dielectric material using a technique such as chemical-mechanical planarization (CMP). The STI regions are formed to define a plurality of isolated device regions in which vertical FETs according to embodiments of the invention are formed. FIGS. 7 and 8 schematically illustrate a method for fabricating STI regions in the surface of the semiconductor substrate 110.

In particular, FIG. 7 is a schematic cross-sectional side view of the semiconductor structure of FIG. 6 after etching portions of the semiconductor substrate 110 exposed through the openings 112-1 of the pad nitride layer 112 to form a pattern of trenches 114 in the surface of the substrate 110. The pattern of trenches 114 can be formed using a standard dry etch process to recess the exposed surface regions of the semiconductor substrate 110 to form the trenches 114. Further, FIG. 8 is schematic cross-sectional side view of the semiconductor structure of FIG. 7 after filling the trenches 114 with insulating/dielectric material to form the STI regions 120. The insulating/dielectric material may include, for example, a conformal SiN liner that is deposited initially to line the sidewalls and bottom surface of the trenches 114, followed by a blanket deposition of an oxide material such as $SiO_2$ or silicon oxynitride (SiON) to fill the trenches 114. The overburden (excess) insulating/dielectric material is removed using CMP, for example, by planarizing the surface of the semiconductor structure down to the surface of the remaining portions of the pad nitride layer 112, as shown in FIG. 8.

A next stage of the exemplary fabrication process comprises forming lower source/drain regions and semiconductor channel layers in the device regions R1 and R2, as schematically illustrated in FIGS. 9, 10, 11 and 12. In one embodiment of the invention, this stage of fabrication generally comprises recessing the device regions (e.g., region R1) in which a first type of FET device and antifuse device (e.g., n-type FET and anti-fuse devices) will be formed, and forming a lower source/drain region and a layer of semiconductor channel material in the device regions R1, followed by recessing the device regions (e.g., region R2) in which a second type of FET device (e.g., p-type FET) will be formed, and forming a lower source/drain region and layer of semiconductor channel material in the device regions R2.

For example, FIG. 9 is a schematic cross-sectional side view of the semiconductor structure of FIG. 8 after recessing the first device region R1 by etching the pad nitride layer 112 and the underlying portion of the semiconductor substrate 110 to form a recess 125 within the active area defined by the surrounding STI regions 120. In one embodiment, the recess 125 is formed by a process which comprises, for example, forming a mask (e.g., photoresist mask) over the surface of the semiconductor structure, which exposes the first device region R1 (as well as other device regions in which the same type of vertical antifuse and/or FET structures will be formed), followed by one or more separate etch processes to remove the portion of the pad nitride 112 in the device region R1, and etch down the underlying portion of the substrate 110 to form the recess 125. In one embodiment, the pad nitride 112 can be etched using a wet etch process or a dry etch process (e.g., RIE). The underlying semiconductor substrate 110 can be etched using a directional RIE etch process or any suitable etch process that etches the material of the semiconductor substrate 110 selective to the insulating material of the surrounding STI regions 120. As shown in FIG. 9, the recess 125 is formed to a depth such that a bottom surface 125-1 of the recess 125 is less than a depth of the adjacent STI regions 120.

A next step in the illustrative fabrication process comprises forming a lower source/drain region and a layer of semiconductor channel material in the device region R1. For example, FIG. 10 is a schematic cross-sectional side view of the semiconductor structure of FIG. 9 after forming the lower source/drain region 130 on the bottom surface 125-1 of the recess 125 within the device region R1, and forming a layer of semiconductor channel material 135 on the lower source/drain region 130 to refill the recess 125. In one embodiment of the invention, the lower source/drain region 130 comprises one or more epitaxially grown and doped semiconductor layers, and the semiconductor channel layer 135 comprises an epitaxially grown layer of intrinsic silicon.

In forming the lower source/drain region 130, a bottom-up epitaxial growth starts on the recessed surface 125-1 of the semiconductor substrate 110 at the bottom of the recess 125, and continues until a desired thickness is obtained for the lower/source drain region 130. The exposed recessed surface 125-1 of the substrate 110 can be cleaned and prepared for epitaxial growth of the lower source/drain region 130. The layer of semiconductor channel material 135 is then epitaxially grown on the lower source/drain region 130 to refill the recess 125 with epitaxial channel material, followed by CMP to remove any overburden channel material and planarize the surface of the semiconductor device down to the STI regions 120.

The lower source/drain region 130 and layer of channel material 135 can be epitaxially grown using known techniques, such as CVD (chemical vapor deposition), MOCVD (metal-organic CVD), LPCVD (Low Pressure CVD), MBE (molecular beam epitaxy), VPE (vapor-phase epitaxy), or other known epitaxial growth techniques which are suitable for the given process flow. The epitaxial deposition is performed selectively so that epitaxial material is not formed on the exposed surfaces of the STI regions 120 and nitride mask layer 112. The type of epitaxial semiconductor material that is used to form the lower source/drain region 130 and the semiconductor channel material 135 will vary depending on various factors. These factors include, but are not limited to, the type of material of the substrate 110, the type of epitaxial material (e.g., channel material 135) that is used to subsequently form the channel fin structures, the device type (e.g., n-type or p-type) that is to be formed in the given device region, etc.

In particular, the epitaxial semiconductor material of the lower source/drain region 130 is preferably selected to have a lattice constant which is the same or similar to the lattice constant of the semiconductor material of the recessed surface 125-1 of the substrate 110, to thereby minimize mechanical stress and reduce lattice defects within the lower source/drain region 130 at the interface between the lower source/drain region 130 and the recessed surface 125-1 of the substrate 110. In one embodiment of the invention, assuming that the recessed surface 125-1 of the substrate 110 comprises crystalline Si or SiGe, for example, the lower source/drain region 130 can be formed of epitaxial Si or epitaxial SiGe, for example. In other alternative embodiments, for a p-type vertical FET, the drain region 130 can be formed using SiC. Moreover, the lower source/drain region 130 can be doped using standard doping techniques. For example, the doping of the lower source/drain region 130 can be performed in-situ during the epitaxial growth of the layer, or ex-situ by ion implantation. For example, the lower source/drain region 130 can be doped with Group III elements (for p-type vertical FET devices) or Group V elements (for n-type vertical FET devices). Typical dopants include Boron, Arsenic, Phosphorus, Gallium, Antimony, etc. For example, boron is a p-type dopant, whereas Phosphorus is an n-type dopant.

In other embodiments, for high-performance applications, the lower source/drain region 130 can be formed of a III-V compound semiconductor material including, but not limited to, GaAs (Gallium Arsenide), InP (Indium Phosphide), InGaAs (Indium Gallium Arsenide), etc. As is known in the art, the use of a compound semiconductor material (e.g., III-V compound semiconductor material) provides a higher carrier mobility than Si and, therefore, allows for the fabrication of high-speed and high-performance semiconductor devices.

Furthermore, in one embodiment of the invention, the layer of semiconductor channel material 135 comprises an epitaxially grown layer of intrinsic silicon, which is not doped, although other types of epitaxial semiconductor materials can be used to form the layer of semiconductor channel material 135 (e.g., $Si_xGe_y$, GaAs, InGaAs), which are suitable for the target application. The type of epitaxial material of the layer of semiconductor channel material 135 is preferably selected to have a lattice constant which is the same or similar to the lattice constant of the epitaxial material of the lower source/drain region 130, to thereby minimize mechanical stress and reduce lattice defects within the layer of semiconductor channel material 135 at the interface with the lower source/drain region 130.

As further shown in FIG. 10, a hard mask layer 138 is formed on the planarized surface of the semiconductor structure to cover, e.g., the layer of semiconductor channel material 135, the STI regions 120, and the pad nitride layer 112. In one embodiment, the hard mask layer 138 is formed by conformally depositing an oxide material over the surface of the semiconductor structure. In other alternative embodiments, the hard mask layer 138 can be formed by conformally depositing a boride, carbide, or a nitride material. The hard mask layer 138 serves to protect the channel material 135 in the device regions R1 in subsequent processing steps to form the lower source/drain region 140 and semiconductor channel material 145 in the second device region R1, using a process as schematically shown in FIGS. 11 and 12.

In particular, FIG. 11 is a schematic cross-sectional side view of the semiconductor structure of FIG. 10 after etching a recess 127 within the active area defined by the surrounding STI regions 120 in the second device region R2. In one embodiment, the recess 127 is formed by a process which comprises, for example, forming a mask (e.g., photoresist mask) over the surface of the semiconductor structure, which exposes the second device region R2 (as well as other device regions in which the same type of vertical FET structures will be formed), followed by one or more separate etch processes to remove the portion of the hard mask layer 138 and the pad nitride layer 112 in the second device region R2, and etch down the underlying portion of the semiconductor substrate 110 to form the recess 127. The hard mask layer 138, the pad nitride layer 112, and the semiconductor substrate 110 are etched using one or more sequential etch processes with etching chemistries that are suitable to etch the respective materials of the hard mask layer 138, the pad nitride layer 112, and the semiconductor substrate 110. As shown in FIG. 11, the recess 127 is formed to a depth such that a bottom surface 127-1 of the recess 127 is less than a depth of the adjacent STI regions 120.

A next step in the illustrative fabrication process comprises forming the lower source/drain region 140 and a layer of semiconductor channel material 145 in the second device region R2. For example, FIG. 12 is a schematic cross-sectional side view of the semiconductor structure of FIG. 11 after forming the lower source/drain region 140 and the layer of channel material 145 within the recess 127 of the device region R2, and removing the remaining portion of the hard mask layer 138. The lower source/drain region 140 and the layer of semiconductor channel material 145 can be formed in the device region R2 using the same or similar materials and methods as discussed above with regard to the formation of the lower source/drain region 130 and channel layer 135 in the device region R1. In an embodiment where p-type devices are formed in the device region R2, the lower source/drain region 140 is formed with an epitaxial material and doping profile that is sufficient for p-type FET devices, while the layer of channel material 145 can be formed of epitaxial intrinsic silicon.

Figure 13:
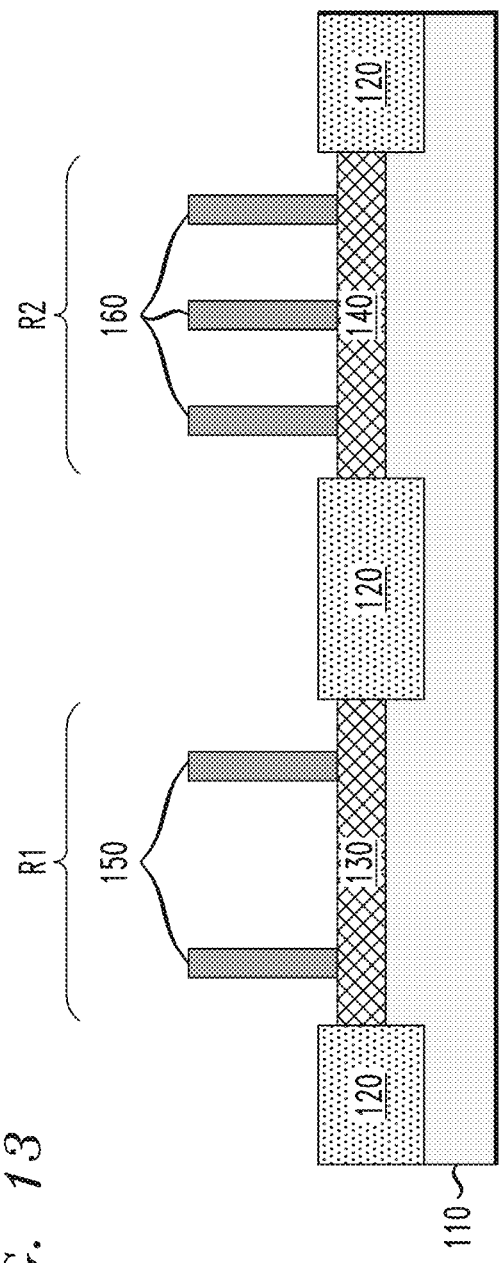

After forming the lower source/drain region 140 and channel layer 145 in the device region R2, the remaining portion of the hard mask layer 138 is removed from the surface of the semiconductor structure. In addition, any remaining pad nitride material 112 is removed from the surface of the semiconductor substrate. Following the pad nitride 112 removal, the fabrication process continues with a process flow which comprises recessing the STI regions 120 down to a level that is slightly higher than an upper surface of the lower source/drain regions 130 and 140, and patterning the layers of semiconductor channel material 135 and 145 to form the vertical semiconductor fins 150 and 160 in the respective device regions R1 and R2, as schematically shown in FIG. 13. In one embodiment of the invention, the vertical semiconductor fins 150 and 160 are patterned using a SIT (sidewall image transfer) photolithography process, as is known in the art. Other standard patterning methods can be used to form the vertical semiconductor fins 150 and 160, the details of which are not necessary for understanding the invention.

It is to be understood that while each device region R1 is shown to have two vertical semiconductor fins 150 and device region R2 is shown to have three vertical semiconductor fins 160, the number of vertical semiconductor fins which are used to form a vertical FET structure in the device regions R1 and R2 can vary depending, depending on the application. As noted above, to implement a 2T memory cell in the device region R1, two vertical semiconductor fins 150 are fabricated. In the active device region R2, the number of semiconductor fins 160 that are formed will vary depending on the target application and integrated circuit layout. In one embodiment, the height (in vertical X direction) of the vertical semiconductor fins 150 and 160 is in a range of 30 nm to about 150 nm, the width (in X direction) of the vertical semiconductor fins 150 and 160 is in the range of about 5 nm to about 30 nm, and a length (in the Y direction) of the vertical semiconductor fins 150 and 160 is in a range of about 10 nm to about 2000 nm. In addition, as shown in FIG. 13, the vertical semiconductor fins 150 in the device region R1 are spaced with a pitch that is greater than the pitch of the vertical semiconductor fins 160 in the device region R2. In one embodiment, the vertical semiconductor fins 160 in the device region R2 are spaced with a pitch in a range of about 20 nm to about 200 nm.

Figure 14:
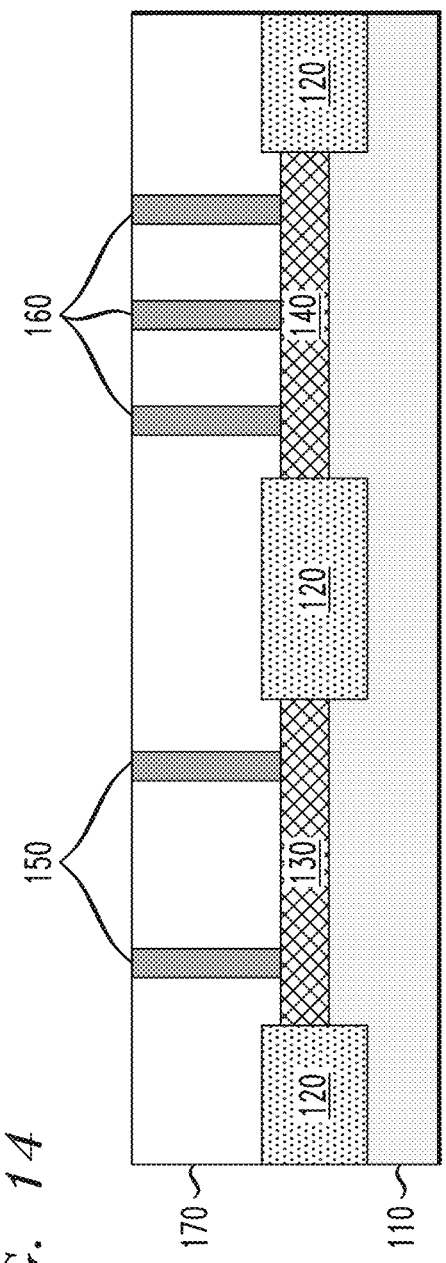
Figure 15:
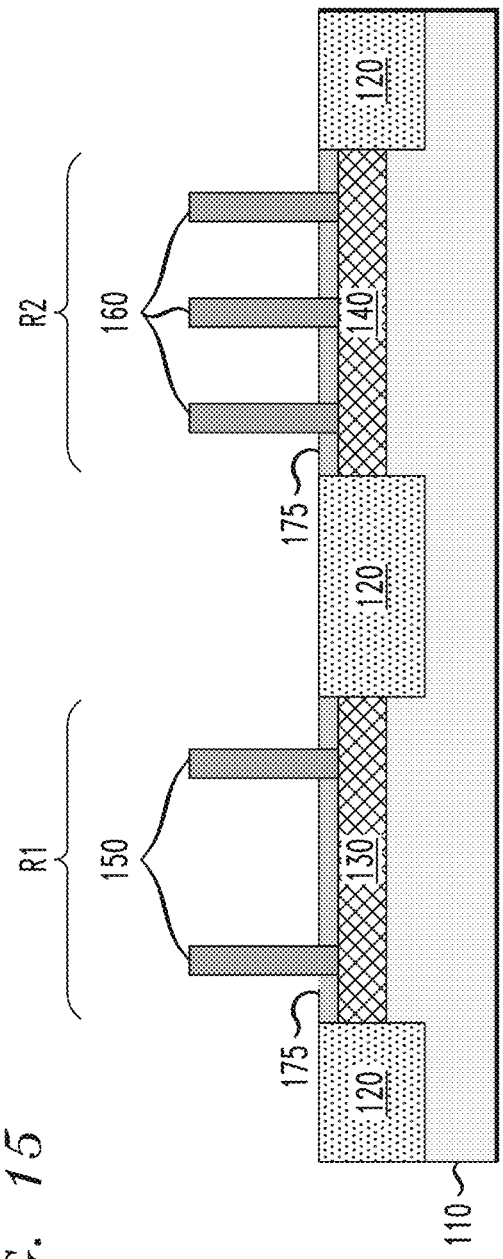

A next process module in the exemplary fabrication process comprises a forming the bottom spacers 175, as schematically illustrated in FIGS. 14 and 15. In particular, FIG. 14 is a schematic cross-sectional side view of the semiconductor structure of FIG. 13 after depositing and planarizing a layer of insulating material 170 over the semiconductor structure. In one embodiment, the layer of insulating material 170 comprises a low-K dielectric material such as silicon oxide (e.g. SiO2), SiN (e.g., (Si3N4), hydrogenated silicon carbon oxide (SiCOH), SiBCN, SiOCN, silicon based low-k dielectrics, porous dielectrics, or other known ULK (ultra-low-k) dielectric materials that are suitable for the given application and process flow. In addition, the layer of insulating material 170 may be deposited using known suitable deposition techniques, such as, for example, atomic layer deposition (ALD), chemical vapor deposition (CVD), plasma enhanced chemical vapor deposition (PECVD), spin on deposition, physical vapor deposition (PVD), or molecular beam deposition (MBD). After depositing the layer of insulating material 170 over the semiconductor structure, the layer of insulating material 170 is planarized (via CMP, for example) down to the upper surfaces of the vertical semiconductor fins 150 and 160, resulting in the semiconductor structure shown in FIG. 14.

Next, FIG. 15 is a schematic cross-sectional side view of the semiconductor structure of FIG. 14 after recessing the planarized layer of insulation material 170 to form the lower insulating spacers 175 in the device regions R1 and R2. With this process, the layer of insulating material 170 is etched highly selective (e.g., greater than 10:1) to the material of the vertical semiconductor fins 150 and 160. The etch process can be performed using wet etch process with an etch solution chemistry that is configured to isotropically etch the layer of insulating material 170 highly selective to the material of the vertical semiconductor fins 150 and 160. Alternatively, a low plasma etch process can be used to etch the layer of insulating material 170 highly selective to the material of the vertical semiconductor fins 150 and 160.

As shown in FIG. 15, the layer of insulating material 170 is recessed down to the upper surfaces of the STI regions 120, wherein the remaining portions of the insulating material 170 between the STI regions 120 form the lower insulating spacers 175. The lower insulating spacers 175 serve to insulate the lower source/drain regions 130 and 140 from gate electrodes that are subsequently formed on the sidewalls of the vertical semiconductor fins 150 and 160. After forming the lower insulating spacers 175, a next process module in the exemplary fabrication process comprises forming metal gate electrodes around the exposed sidewalls of the vertical semiconductor fins 150 and 160, using a process flow as schematically illustrated in FIGS. 16 through 22.

Figure 16:
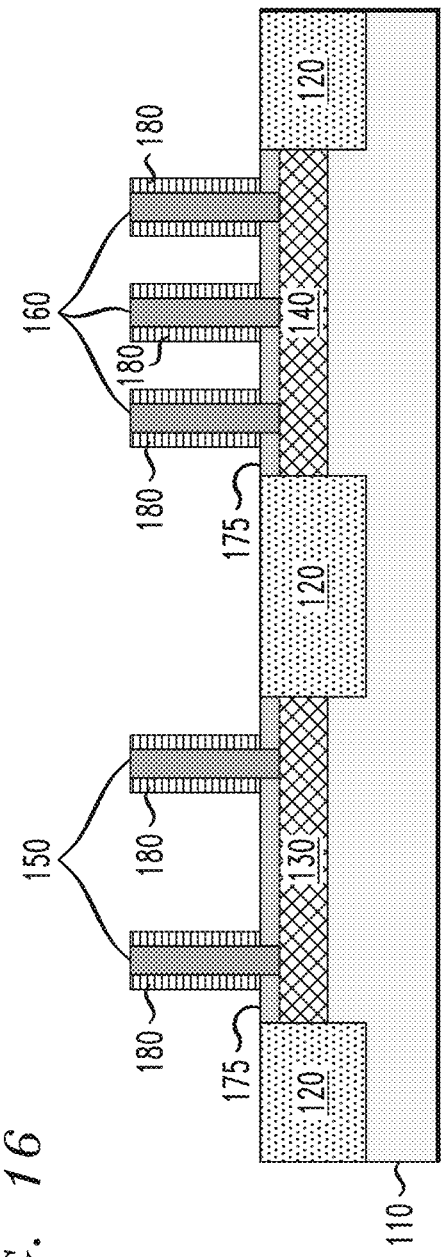

For example, FIG. 16 is a schematic cross-sectional side view of the semiconductor structure of FIG. 15 after forming high-k metal gate stack structures 180 on the exposed sidewalls of the vertical semiconductor fins 150 and 160. In one embodiment of the invention, as noted above, each high-k metal gate stack structure 180 comprises a thin conformal gate dielectric layer that is formed on the exposed sidewalls of the semiconductor fins 150 and 160, and a thin conformal work function metal (WFM) layer that is formed on the gate dielectric layer.

In one embodiment, the high-k metal gate stack structures 180 are formed, e.g., by depositing one or more conformal layers of gate dielectric material over the structure of FIG. 15, and depositing one or more conformal layers of work function metal over the conformal layer(s) of gate dielectric material. Thereafter, one or more directional dry etch processes are performed using known etching methods and etch chemistries to remove the portions of the gate dielectric material and work function metal on top of the vertical semiconductor fins 150/160 and other horizontal surfaces of the semiconductor structure, while maintaining the gate dielectric material and work function metal on the sidewalls of the vertical semiconductor fins 150/160, resulting in the semiconductor structure as shown in FIG. 16.

The type of dielectric material(s) used to form the gate dielectric layer will vary depending on the application. For example, the conformal gate dielectric layer may comprise, e.g., nitride, oxynitride, or oxide or high-k materials such as, $HfO_2$, $HfSiO_4$, HfSiON, ZrO2, $Al_2O_3$, $TiO_2$, $Ta_2O_5$ $La_2O_3$, $SrTiO_3$, $LaAlO_3$, and combinations thereof. In one embodiment of the invention, the conformal dielectric material has a thickness in a range of about 0.5 nm to about 2.5 nm, which will vary depending on the target application. The conformal dielectric layer is deposited using known methods such as ALD, CVD, or PVD, for example. Further, the work function metal may comprise one or more of, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination thereof.

The high-k metal gate stack structures 180 formed on the vertical semiconductor fins 150 and 160 may be formed of the same materials or different materials, depending on the application (e.g., n-type or p-type vertical FET). When different materials are used to form the high-k metal gate stack structures 180 in the different device regions R1 and R2, the high-k metal gate stack structures 180 in the device regions R1 and R2 can be separately formed using known techniques. In one embodiment, the total thickness of the high-k metal gate stack structures 180 is in a range of about 5 nm to about 15 nm.

Moreover, at this stage of fabrication, as noted above, high-k metal gate stack structures 180 formed on the vertical semiconductor fins 150 may have different thicknesses in embodiments where the vertical FET device T1 and the vertical antifuse device T2 have commonly connected gate terminals (which are commonly connect to the same word line in a OTP memory array). This would allow a programming voltage VPP to be commonly applied to the gate terminals of the vertical devices T1 and T2 and cause a hard breakdown of the thinner high-k metal gate stack structure 180 on the vertical semiconductor fin 150 of the vertical antifuse device T2, while avoiding damage to the high-h metal gate stack structure on the vertical semiconductor fine 150 of the vertical FET device T1. In one embodiment, the thickness the high-k gate stack structures 180 can be varied by forming a thinner layer of gate dielectric material on the semiconductor fins 150 that are used for the vertical antifuse devices T2. Any suitable dual-gate process can be implemented in the device region R1 to form different thickness of the gate dielectric layer on the different vertical semiconductor fins 150 for the vertical devices T1 and T2.

Figure 17:
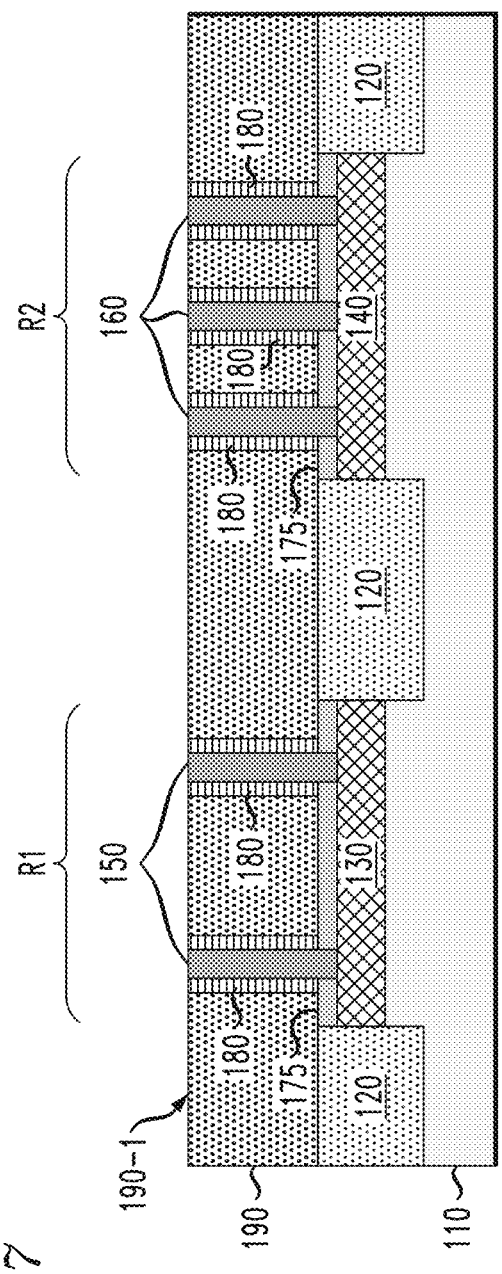

A next step in the exemplary process flow is to deposit metallic gate electrode material that surrounds the high-k gate stack structures 180 and thereby form the metal gate electrodes 200. For example, FIG. 17 is a schematic cross-sectional side view of the semiconductor structure of FIG. 16 after depositing a layer of gate electrode material 190 and planarizing the layer of gate electrode material 190 down to the upper surface of the vertical semiconductor fins 150/160 to provide a planarized surface 190-1. In one embodiment of the invention, the layer of gate electrode material 190 comprises a low-resistance conductive material including, but not limited to, tungsten, aluminum, or any metallic or conductive material that is commonly used to form gate electrode structures. The layer of gate electrode material 190 can be deposited by CVD or PE-CVD, and planarized via CMP.

Figure 18:
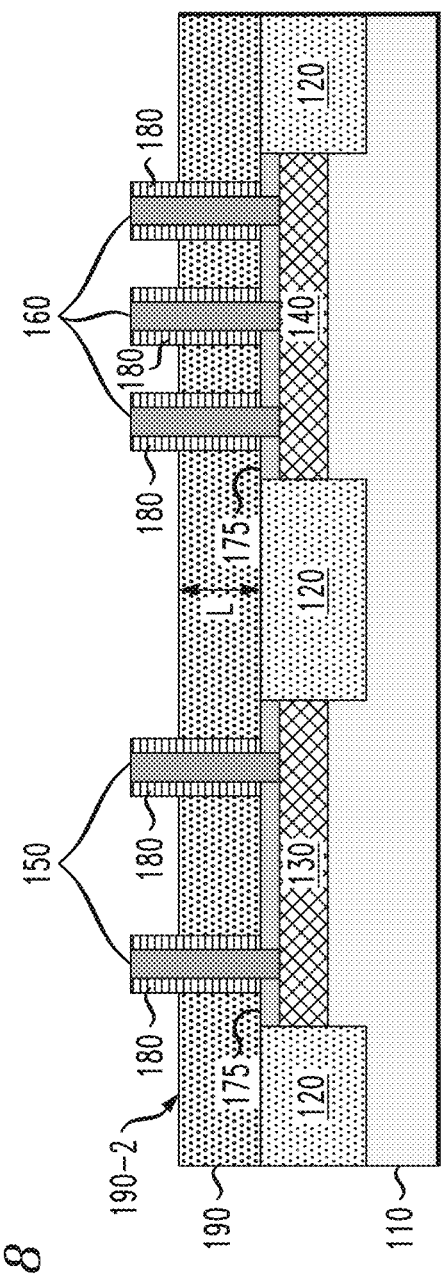

Following planarization of the gate electrode material 190, a next step comprises recessing the layer of gate electrode material 190 in the device regions R1 and R2 to define a gate length L for the vertical FETs in the device regions R1 and R2, as schematically illustrated in FIGS. 18. In particular, FIG. 18 is a schematic cross-sectional side view of the semiconductor structure of FIG. 17 after recessing the layer of gate electrode material 190 in the device regions R1 and R2 such that a recessed surface 190-2 of the gate electrode material 190 has a resulting thickness that defines a gate length L. In one embodiment, the gate electrode recess process is performed to define the gate length L of the vertical FET devices in the device regions R1 and R2, while leaving a portion of the layer of gate electrode material 190 (which is disposed adjacent to end portions of the vertical semiconductor fins 150/160) at the level of the planarized surface 190-1 of the gate electrode material 190. In one embodiment of the invention, the height L of the recessed surface 190-2 of the gate electrode material 190 above the surface of the bottom insulating spacer 175 is in a range of about 15 nm to about 300 nm.

A next step in the illustrative fabrication process comprises removing a portion of the high-k metal gate stack structures 180 on the sidewalls of the upper portions of the vertical semiconductor fins 150/160. For example, FIG. 19 is a schematic cross-sectional side view of the semiconductor structure of FIG. 18 after recessing the exposed portions of the high-k metal gate stack structures 180 on the sidewalls of the vertical semiconductor fins 150/160 down to a level of the recessed surface 190-2 of the gate electrode material 190. The gate dielectric material and work function metal of the high-k gate stack structures 180 can be etched highly selective to the materials of the vertical semiconductor fins 150/160 and the gate electrode material 190 using known etching techniques and suitable etch chemistries. In one embodiment of the invention, the exposed portions of the vertical semiconductor fins 150/160 extend above the recessed surface 190-2 in a range of about 25 nm to about 100 nm.

Following the recess of the high-k gate stack structures 180, a next step in the illustrative fabrication process comprises forming disposable spacers that are used to etch the gate electrode material 190 and thereby form individual gate electrodes on the high-k gate stack structures 180 surrounding the vertical semiconductor fins 150/160. For example, FIG. 20 is a schematic cross-sectional side view of the semiconductor structure of FIG. 19 after depositing a thin conformal layer of spacer material layer 195 over surface of the semiconductor structure. The conformal layer of spacer material 195 can be an oxide or a nitride material (e.g., $SiO_2$, SiN) which is deposited using any suitable deposition method, such as an ALD or PE-ALD process.

Next, a directional etch process (e.g., RIE) is performed to etch the conformal layer of spacer material 195 and form disposable spacers 195-1 on the sidewalls of the vertical semiconductor fins 150/160, as shown in FIG. 21. The sidewalls of the disposable spacers 195-1 extend past the sidewalls of the high-k gate stack structures 180 at a given distance, and this distance defines the thickness of the individual gate electrodes 190 that are to be formed on the sidewall surfaces of the high-k gate stack structures 180 after etching the layer of gate electrode material 190 using the disposable spacers 198 as an etch mask.

In particular, FIG. 22 is a schematic cross-sectional side view of the semiconductor structure of FIG. 21 after using the disposable spacers 195-1 as an etch mask to etch the exposed portions of the gate electrode material 190 to form metal gate electrodes 200 on the vertical semiconductor fins 150/160. With the etch process, the exposed portions of the gate electrode material 190 is recessed down to the STI regions 120 and bottom spacer 175, whereas the portions of the gate electrode material 190 that are covered by the disposable spacers 195-1 remain on the sidewall surfaces of the gate stack structure 180 to form the metal gate electrodes 200. Each metal gate electrode 200 includes a high-k metal gate stack 180 and a gate electrode layer 190. In one embodiment of the invention, the gate electrode material 190 which remains on the sidewall surface of the high-k gate stack structure 180 has a thickness in a range of about 2 nm to about 5 nm.

Figure 23:
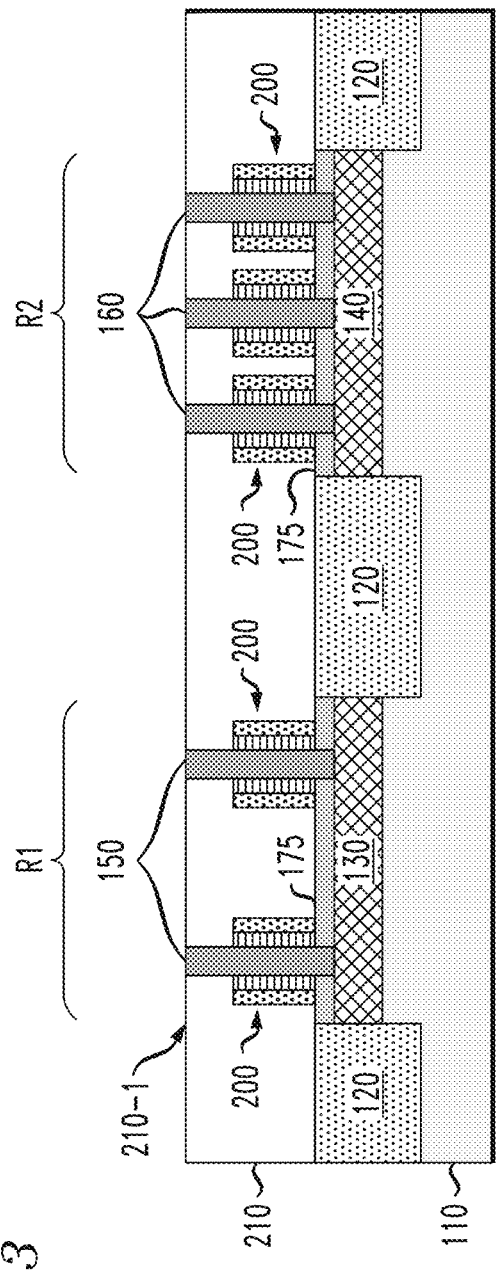
Figure 24:
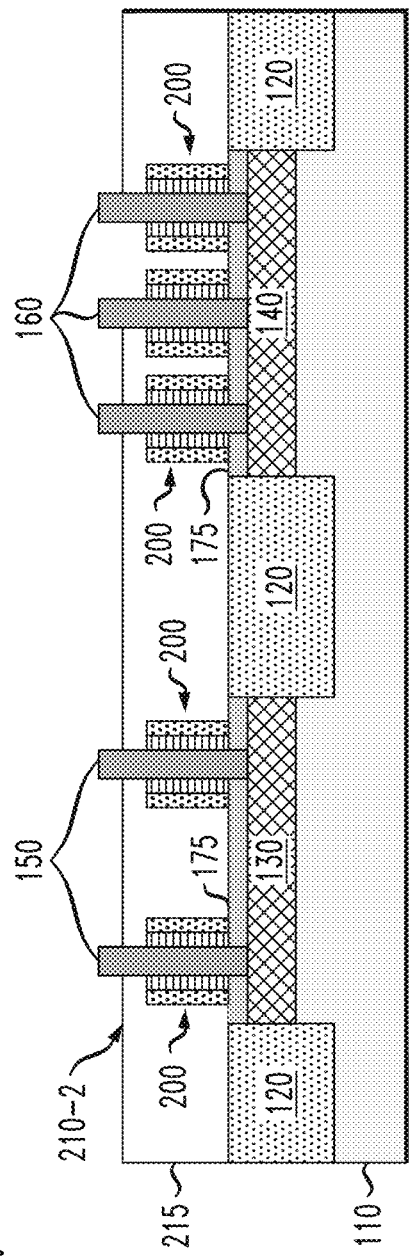

A next step in the illustrative fabrication process is to form the upper insulating spacer 215, using a process flow as schematically illustrated in FIGS. 23 and 24. In particular, FIG. 23 is a schematic cross-sectional side view of the semiconductor structure of FIG. 22 after removing the disposable spacers 195-1 from the upper portions of the vertical semiconductor fins 150/160. depositing a layer of insulating spacer material 210 over the surface of the semiconductor structure, and planarizing the layer of insulating spacer material 210 down to the upper surface of the vertical semiconductor fins 150/160 to provide a planarized surface 210-1. In one embodiment of the invention, the insulating spacer material 210 comprises a low-k dielectric material such as SiO2, SiN, SiBCN or SiOCN, or other dielectric materials that are suitable for the given application and process flow such as SiN, hydrogenated silicon carbon oxide, silicon based low-k dielectrics, porous dielectrics, or organic dielectrics including porous organic dielectrics. In addition, the insulating spacer material 210 may be formed using known suitable deposition techniques, such as, for example, ALD, CVD, PECVD, spin on deposition, PVD, or MBD.

Further, FIG. 24 is a schematic cross-sectional side view of the semiconductor structure of FIG. 23 after recessing the layer of insulating spacer material 210 to form the upper insulating spacer 215 having a recessed surface 210-2 below an upper surface of the vertical semiconductor fins 150/160. In one embodiment of the invention, the insulating spacer material 210 is recessed using a directional dry etch process (e.g., RIE). The etch process is performed to etch the layer of insulating spacer material 210 highly selective to the material of the vertical semiconductor fins 150/160. The upper insulating spacer 215 serves to insulate the metal gate electrodes 200 from surrounding structures. In one embodiment of the invention, the lower insulating spacers 175 and the upper insulating spacer 215 are made of the same material. In another embodiment, the spacers 175 and 215 can be formed of different low-k dielectric materials.

Figure 25:
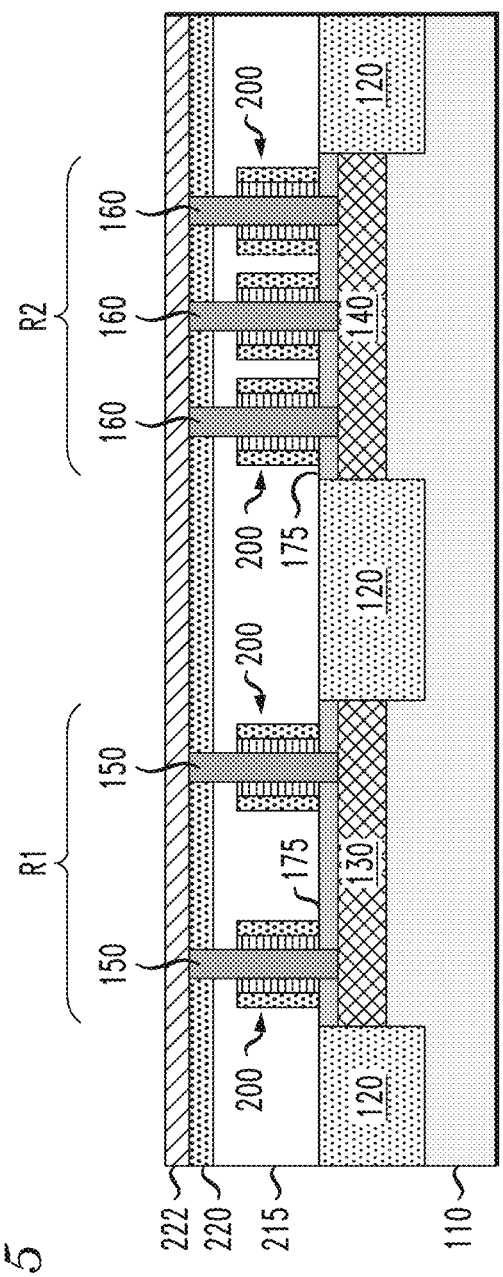

After forming the upper insulating spacer 215, the process flow continues with forming the upper source/drain regions of the vertical FET devices in the device regions R1 and R2 using a process flow as schematically illustrated in FIGS. 25 through 31, according to an embodiment of the invention. In particular, FIG. 25 is a schematic cross-sectional side view of the semiconductor structure of FIG. 23 after forming an ILD 220 over the upper insulating spacer 215 and forming a hard mask layer 222 over the ILD layer 220. The ILD layer 220 is formed by depositing a conformal layer of dielectric material over the surface of the semiconductor structure of FIG. 24, and then planarizing the dielectric material down to the upper surface of the vertical semiconductor fins 150/160. In one embodiment of the invention, the ILD layer 220 is formed of a material that is different from the dielectric material of the upper insulating spacer 215. For example, the ILD layer 220 may be formed of an oxide, such as $SiO_2$, using suitable deposition techniques, whereas the upper insulating spacer 215 is formed of a silicon nitride. In one embodiment, the hard mask layer 222 is formed by depositing layer of nitride material, such as SiN, or some other suitable material that can be etched selectively to the ILD layer 220.

Figure 26:
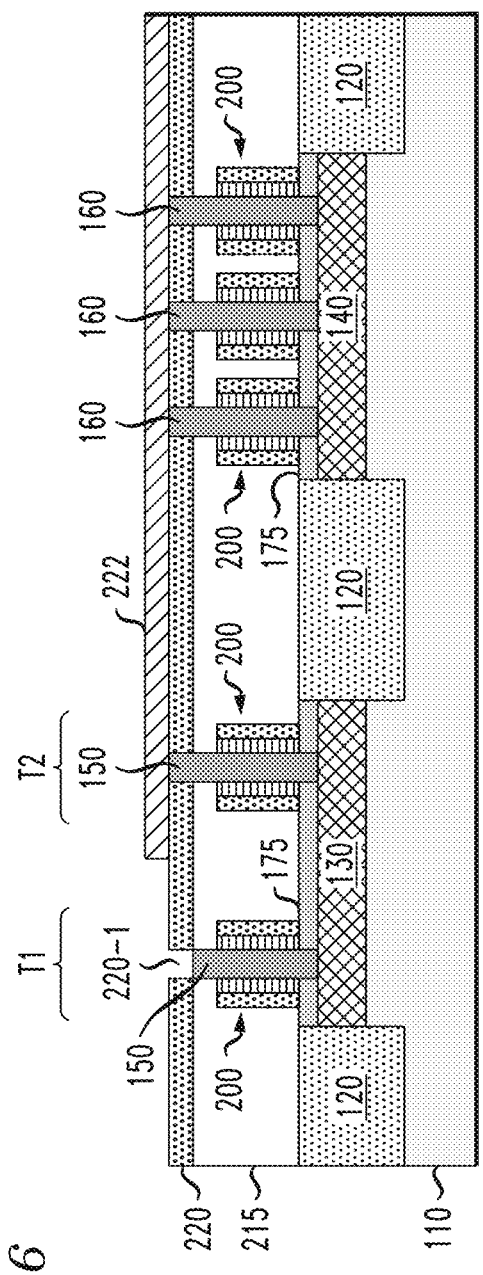

A next step in the illustrative fabrication process comprises patterning the hard mask layer 222 to expose portions of the ILD layer 220 in the device region R1, and then etching the upper portions of the exposed vertical semiconductor fins 150 to form openings in which the upper/source regions are epitaxially grown. For example, FIG. 26 is a schematic cross-sectional side view of the semiconductor structure of FIG. 25 after patterning the hard mask layer 222 to expose portions of the ILD layer 220 above the vertical FET device T1 in the device region R1, and etching down the upper portion of the vertical semiconductor fin 150 of the vertical FET device T1 to form an opening 220-1 in the ILD layer 220. In one embodiment, the vertical semiconductor fin 150 is recessed down to at least the level of the upper insulating spacer 215, for example, wherein the upper surface of vertical semiconductor fin 150 is approximately co-planar with the interface between the ILD layer 220 and the upper insulating spacer 215, as shown in example embodiment of FIG. 26.

Figure 27:
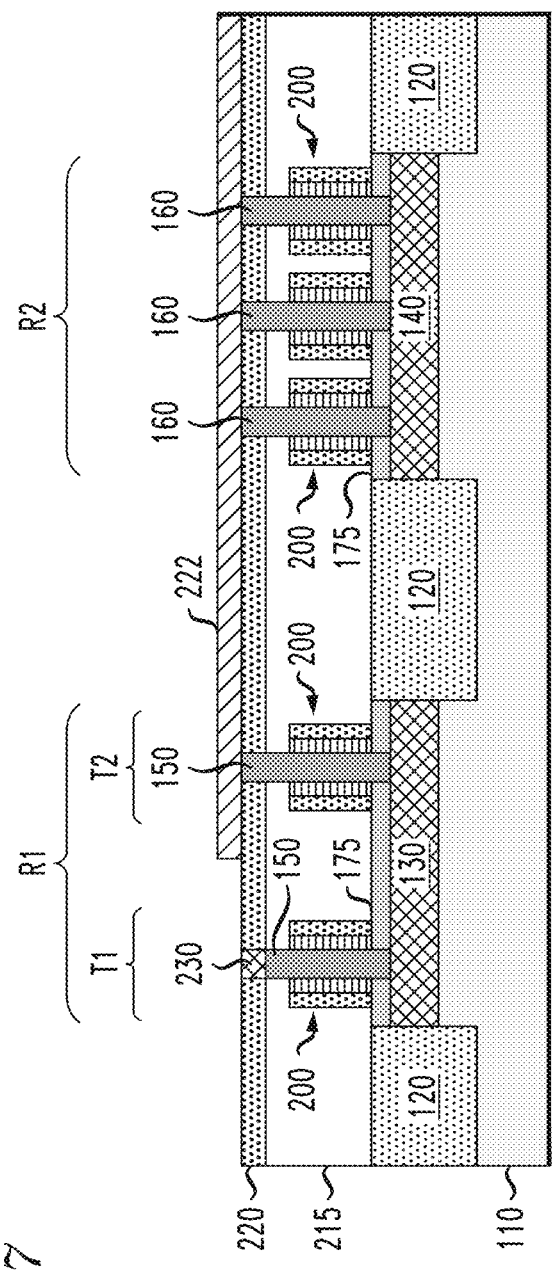

Next, FIG. 27 is a schematic cross-sectional side view of the semiconductor structure of FIG. 26 after forming the upper source/drain region 230 on top of the vertical semiconductor fin 150 of the vertical FET device T1, which is exposed through the opening 220-1 in the ILD layer 220. In one embodiment, the upper source/drain region 230 comprises epitaxial semiconductor material that is grown on top of the vertical semiconductor fin 150 using known techniques. Depending on the type of vertical devices being formed in the device region R1 (e.g., n-type or p-type), the upper source/drain region 230 can be formed of epitaxial Si, SiGe, SiC, or SiP materials, and doped with boron, phosphorus, or carbon.

For example, in one embodiment of the invention, the upper source/drain region 230 may comprise silicon-germanium films that are epitaxially grown using known techniques such as CVD, MBE, or MOCVD, wherein $SiH4$ and $GeH4$ can be used as the sources for epitaxial growth of the SiGe source/drain structures. In another embodiment, the upper source/drain region 230 may be formed by epitaxial growth of carbon-doped silicon (Si:C) using a Si containing gas such as $SiH_4$ and a carbon containing gas such as $CH_4$. In other embodiments, the upper source/drain region 230 may be in-situ doped during epitaxial growth by adding a dopant gas to the source deposition gas (i.e., the Si-containing gas). Exemplary dopant gases may include a boron-containing gas such as $BH_3$ for p-type vertical FETs or a phosphorus or arsenic containing gas such as $PH_3$ or $AsH_3$ for n-type vertical FETs, wherein the concentration of impurity in the gas phase determines the dopant concentration in the epitaxially grown upper source/drain region 230.

It is to be understood that the process flow shown in FIGS. 26 and 27 is implemented in an embodiment where no upper/source drain region is formed on top of the vertical semiconductor fin 150 of the vertical antifuse device T2. In another embodiment as discussed above with reference to FIGS. 2A/2B, upper source/drain regions 230 can be formed on top of all vertical semiconductor fins 150 in the device region R1, but wherein no vertical upper source/drain contact is subsequently made to the upper source/drain region 230 of the vertical antifuse device T2.

Figure 28:
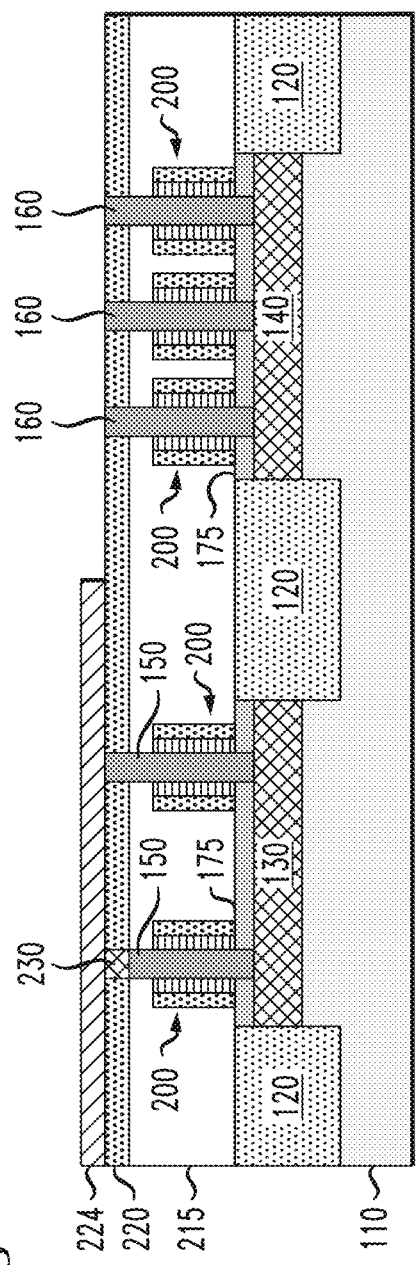

Following formation of the upper source/drain regions 230 in the device region R1, the patterned hard mask layer 222 is removed, and the process is repeated to form the upper source/drain regions 240 for the vertical FET devices in the device region R2. For example, FIG. 28 is a schematic cross-sectional side view of the semiconductor structure of FIG. 27 after removing the patterned hard mask layer 222, and depositing and patterning another hard mask layer 224 to expose portions of the ILD layer 220 above the vertical semiconductor fins 160 in the device region R2. The hard mask layer 224 is formed by depositing layer of nitride material, such as SiN, or some other suitable material that can be etched selectively to the ILD layer 220 to pattern the hard mask layer 224.

Figure 29:
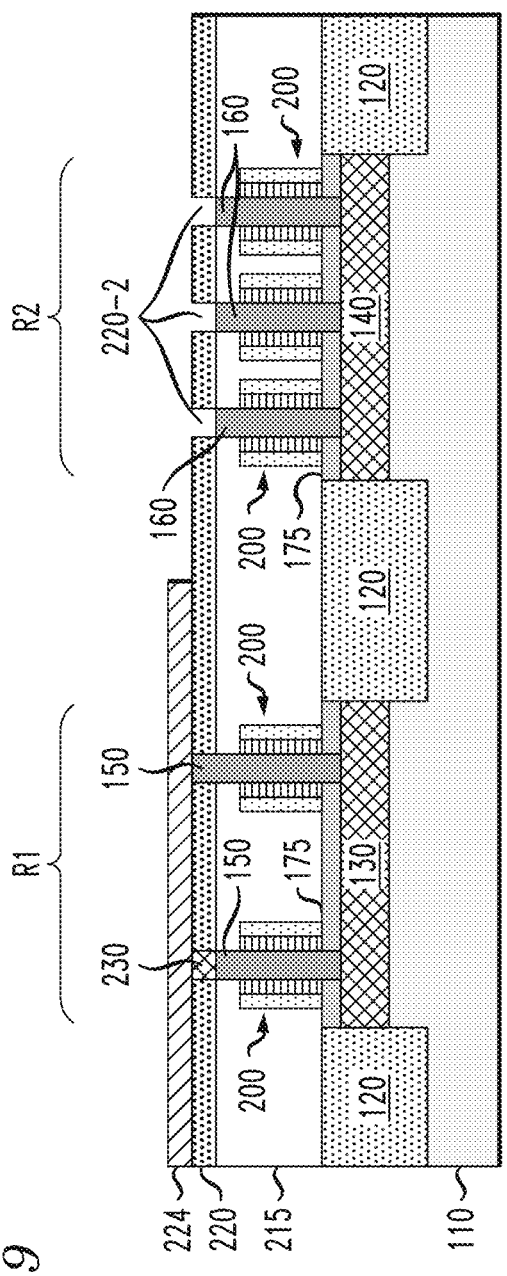

Next, FIG. 29 is a schematic cross-sectional side view of the semiconductor structure of FIG. 28 after etching down the exposed upper portions of the vertical semiconductor fins 160 to form openings 220-2 in the ILD layer 220. In one embodiment, the vertical semiconductor fins 160 are recessed down to at least the level of the upper insulating spacer 215, for example, wherein the upper surface of vertical semiconductor fins 160 are approximately co-planar with the interface between the ILD layer 220 and the upper insulating spacer 215, as shown in example embodiment of FIG. 29.

Figure 30:
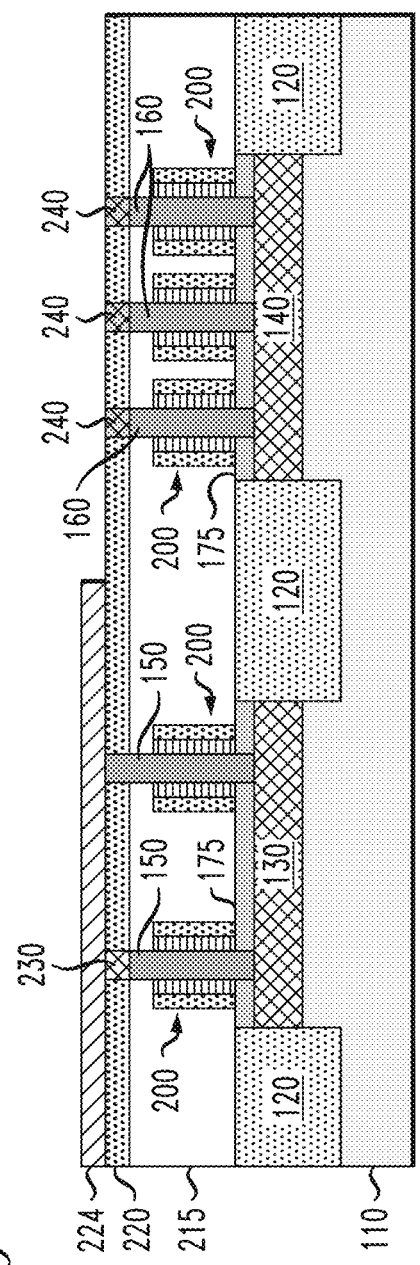
Figure 31:
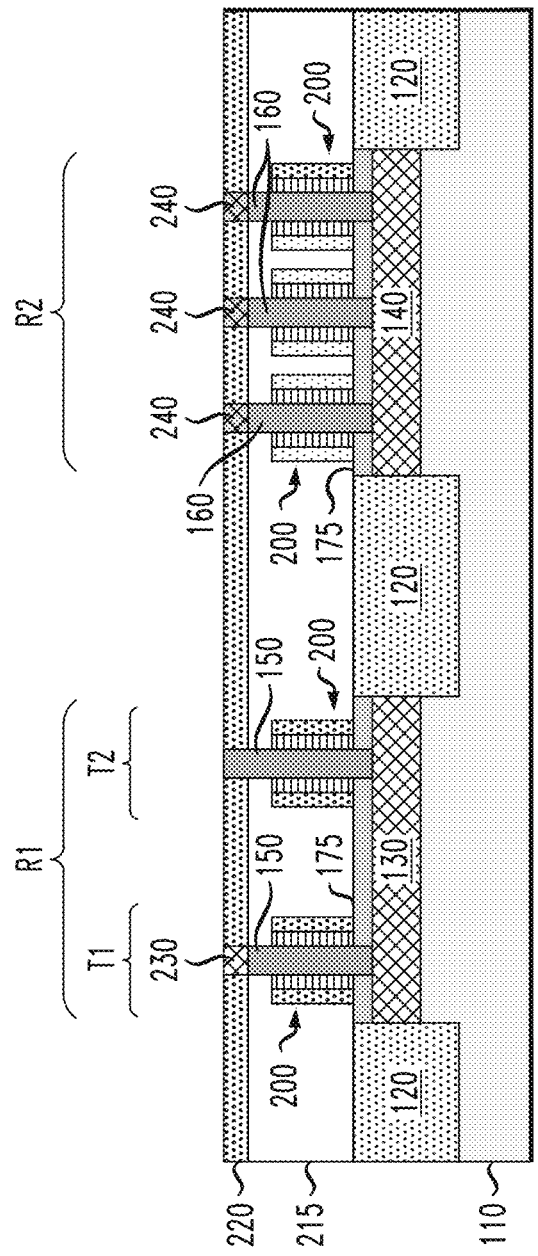

FIG. 30 is a schematic cross-sectional side view of the semiconductor structure of FIG. 29 after forming the upper source/drain regions 240 on top of the vertical semiconductor fins 160 in the openings 220-2 of the ILD layer 220 in the device region R2. The upper source/drain regions 240 comprise epitaxial semiconductor material that is grown on top of the vertical semiconductor fins 160 using known techniques. Depending on the type of vertical FETs that are being formed in the device region R2 (e.g., n-type or p-type), the upper source/drain regions 240 may comprise epitaxial semiconductor materials that are grown and doped using materials and methods as discussed above with reference to FIG. 27 with regard to formation of the upper source/drain regions 230 in the device region R1. Following formation of the upper source/drain regions 240, the patterned hard mask layer 224 is removed, resulting in the semiconductor structure shown in FIG. 31.

The next steps in the fabrication process comprise forming the capping layer 250, forming the vertical contact 280 to the lower source/drain region 140, forming the vertical contacts 260 and 262 to the upper source/drain regions 230 and 240, and forming the vertical contacts 270, 272, and 274 to the metal gate electrodes 200, resulting in the semiconductor device shown in FIGS. 1A/1B. The capping layer 250 and vertical contacts 260, 262, 270, 272, 274, and 280 can be formed using known materials and methods, the details of which are not necessary for understanding inventive concepts discussed herein.

It is to be understood that the methods discussed herein for fabricating vertical FET device and vertical antifuse structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
   forming a lower source/drain region on a semiconductor substrate;
   forming a plurality of vertical semiconductor fins on the lower source/drain region, the plurality of vertical semiconductor fins comprising a first vertical semiconductor fin and a second vertical semiconductor fin;
   forming a first metal gate electrode on a sidewall surface of the first vertical semiconductor fin, and a second metal gate electrode on a sidewall surface of the second vertical semiconductor fin;
   forming an insulating layer to insulate the first and second metal gate electrodes;
   forming an upper source/drain region on an upper surface of the first vertical semiconductor fin;
   forming a vertical source/drain contact to the upper source/drain region formed on the upper surface of the first vertical semiconductor fin; and
   encapsulating an upper end of the second vertical semiconductor fin in an insulating material so that the upper end of the second vertical semiconductor fin is floating.

2. The method of claim 1, wherein the first vertical semiconductor fin, the first metal gate electrode, the lower source/drain region, and the upper source/drain region comprise a vertical FET (field effect transistor) device, and wherein the second vertical semiconductor fin, the second metal gate electrode, and the lower source/drain region comprise a vertical antifuse device.

3. The method of claim 2, wherein the vertical FET device and the vertical antifuse device comprise a 2T memory cell of an OTP (one time programmable) memory array.

4. The method of claim 1, wherein forming the plurality of vertical semiconductor fins on the lower source/drain region comprises:
   epitaxially growing a layer of semiconductor material on the lower source/drain region; and
   patterning the layer of semiconductor material to form the plurality of vertical semiconductor fins.

5. The method of claim 1, wherein forming the first metal gate electrode on the sidewall surface of the first vertical semiconductor fin, and forming the second metal gate electrode on the sidewall surface of the second vertical semiconductor fin comprises:
   forming a first high-k metal gate stack structure on the sidewall surface of the first vertical semiconductor fin;
   forming a second high-k metal gate stack structure on the sidewall surface of the second vertical semiconductor fin;
   depositing and patterning a layer of metallic material to form a first gate electrode layer on the first high-k metal gate stack structure and a second gate electrode layer on the second high-k metal gate stack structure.

6. The method of claim 5, wherein the first and second high-k metal gate stack structures have a same thickness.

7. The method of claim 5, wherein the second high-k metal gate stack structure is thinner than the first high-k metal gate stack structure.

8. The method of claim 1, further comprising forming a common vertical gate contact to the first and second metal gate electrodes.

9. The method of claim 1, further comprising:
   forming a first vertical gate contact to the first metal gate electrode; and
   forming a second vertical gate contact to the second metal gate electrode.

10. The method of claim 1, further comprising:
    forming an upper source/drain region on an upper surface of the second vertical semiconductor fin;
    wherein encapsulating an upper end of the second vertical semiconductor fin in an insulating material comprises encapsulating the upper source/drain region on the upper surface of the second vertical semiconductor fin in the insulating material so that the upper source/drain region of the second vertical semiconductor fin is floating.

11. A semiconductor device, comprising:
    a lower source/drain region formed on a semiconductor substrate;
    a plurality of vertical semiconductor fins formed on the lower source/drain region, the plurality of vertical semiconductor fins comprising a first vertical semiconductor fin and a second vertical semiconductor fin;
    a first metal gate electrode formed on a sidewall surface of the first vertical semiconductor fin, and a second metal gate electrode formed on a sidewall surface of the second vertical semiconductor fin;

an insulating layer to insulate the first and second metal gate electrodes;

an upper source/drain region formed on an upper surface of the first vertical semiconductor fin; and a vertical source/drain contact formed in contact with the upper source/drain region formed on the upper surface of the first vertical semiconductor fin;

wherein an upper end of the second vertical semiconductor fin is encapsulated in an insulating material so that the upper end of the second vertical semiconductor fin is floating.

12. The semiconductor device of claim 11, wherein the first vertical semiconductor fin, the first metal gate electrode, the lower source/drain region, and the upper source/drain region comprise a vertical FET (field effect transistor) device, and wherein, the second vertical semiconductor fin, the second metal gate electrode, and the lower source/drain region comprise a vertical antifuse device.

13. The semiconductor device of claim 12, wherein the vertical FET device and the vertical antifuse device comprise a 2T memory cell, of an OTP (one time programmable) memory array.

14. The semiconductor device of claim 11, wherein the plurality of vertical semiconductor fins on the lower source/drain region comprise epitaxial semiconductor material, that is epitaxially grown on the lower source/drain region.

15. The semiconductor device of claim 11, wherein the first metal gate electrode comprises:

a first high-k metal gate stack structure formed on the sidewall surface of the first vertical semiconductor fin; and a first gate electrode layer formed on the first high-k metal gate stack structure; and wherein the second metal gate electrode comprises:

a second high-k metal gate stack structure formed on the sidewall surface of the second vertical semiconductor fin; and a second gate electrode layer formed on the second high-k metal gate stack structure.

16. The semiconductor device of claim 15, wherein the first and second high-k metal gate stack structures have a same thickness.

17. The semiconductor device of claim 15, wherein the second high-k metal gate stack structure is thinner than the first high-k metal gate stack structure.

18. The semiconductor device of claim 11, further comprising a common vertical gate contact formed in contact with the first and second metal gate electrodes.

19. The semiconductor device of claim 11, further comprising:

a first vertical gate contact formed in contact with first metal gate electrode; and a second vertical gate contact formed in contact with the second metal gate electrode.

20. The semiconductor device of claim 11, further comprising:

an upper source/drain region formed on an upper surface of the second vertical semiconductor fin;

wherein the upper source/drain region on the upper surface of the second vertical semiconductor fin is encapsulated in the insulating material so that the upper source/drain region of the second vertical semiconductor fin is floating.

* * * * *